US011482571B2

(12) United States Patent
Chiang et al.

(10) Patent No.: US 11,482,571 B2
(45) Date of Patent: Oct. 25, 2022

(54) MEMORY ARRAY WITH ASYMMETRIC BIT-LINE ARCHITECTURE

(71) Applicant: Taiwan Semiconductor Manufacturing Co., Ltd., Hsin-Chu (TW)

(72) Inventors: Hung-Li Chiang, Taipei (TW); Chao-Ching Cheng, Hsinchu (TW); Jung-Piao Chiu, Kaohsiung (TW); Tzu-Chiang Chen, Hsinchu (TW); Yu-Sheng Chen, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 218 days.

(21) Appl. No.: 16/908,896

(22) Filed: Jun. 23, 2020

(65) Prior Publication Data

US 2021/0399054 A1    Dec. 23, 2021

(51) Int. Cl.
*H01L 23/538*    (2006.01)
*H01L 27/24*    (2006.01)
*H01L 45/00*    (2006.01)
*G11C 13/00*    (2006.01)

(52) U.S. Cl.
CPC ........ *H01L 27/2463* (2013.01); *G11C 13/003* (2013.01); *G11C 13/004* (2013.01); *G11C 13/0026* (2013.01); *G11C 13/0028* (2013.01); *G11C 13/0069* (2013.01); *H01L 27/2409* (2013.01); *H01L 45/16* (2013.01); *G11C 2013/0045* (2013.01); *G11C 2013/0078* (2013.01)

(58) Field of Classification Search
CPC ..................................................... H01L 23/538
See application file for complete search history.

(56) References Cited

U.S. PATENT DOCUMENTS

| | | | |
|---|---|---|---|
| 9,524,980 | B2 | 12/2016 | Lue |
| 9,972,386 | B2 | 5/2018 | Blomme et al. |
| 2005/0139935 | A1 | 6/2005 | Lee |
| 2010/0178729 | A1 | 7/2010 | Yoon et al. |
| 2012/0161096 | A1 | 6/2012 | Pellizzer et al. |
| 2020/0144329 | A1 | 5/2020 | Sciarrillo et al. |
| 2020/0176032 | A1 | 6/2020 | Chiang et al. |

FOREIGN PATENT DOCUMENTS

| | | |
|---|---|---|
| CN | 102637693 A | 8/2012 |
| KR | 20080012241 A | 2/2008 |

*Primary Examiner* — Marvin Payen
(74) *Attorney, Agent, or Firm* — Eschweiler & Potashnik, LLC

(57) ABSTRACT

The present disclosure relates to an integrated circuit. The integrated circuit has a plurality of bit-line stacks disposed over a substrate and respectively including a plurality of bit-lines stacked onto one another. A data storage structure is over the plurality of bit-line stacks and a selector is over the data storage structure. A word-line is over the selector. The selector is configured to selectively allow current to pass between the plurality of bit-lines and the word-line. The plurality of bit-line stacks include a first bit-line stack, a second bit-line stack, and a third bit-line stack. The first and third bit-line stacks are closest bit-line stacks to opposing sides of the second bit-line stack. The second bit-line stack is separated from the first bit-line stack by a first distance and is further separated from the third bit-line stack by a second distance larger than the first distance.

20 Claims, 15 Drawing Sheets

|  | Word-line | | Bit-line | |
| --- | --- | --- | --- | --- |
|  | Sel. | Unsel. | Sel. | Unsel. |
| Read | 0.8V-1.0V | 0.24V-0.3V | 0V | 0.48V-0.6V |
| Set | 1.2-1.5V | 0.36V-0.45V | 0V | 0.72V-0.9V |
| Reset | 0V | 0.72V-0.9V | 1.2-1.5V | 0.36V-0.45V |
| Forming | 1.8-2.0V | 0.6V-0.67V | 0V | 1.2V-1.34V |

| Apply first voltage to first word-line that is coupled to first RRAM device through first selector having first threshold voltage and to second RRAM device through second selector having second threshold voltage | ─310 |

| Apply second voltage to second word-line that is coupled to third RRAM device through third selector having third threshold voltage and to fourth RRAM device through fourth selector having fourth threshold voltage | ─312 |

| Apply third voltage to first bit-line coupled to first and third RRAM devices, wherein a difference between the first voltage and the third voltage is greater than the first threshold voltage and a difference between the second voltage and the third voltage is less than the third threshold voltage | ─314 |

| Apply fourth voltage to second bit-line coupled to second and fourth RRAM devices, wherein differences between the second voltage and the fourth voltage and between the second voltage and the third voltage are less than the second and third threshold voltages | ─316 |

Fig. 3E

MEMORY ARRAY WITH ASYMMETRIC BIT-LINE ARCHITECTURE

BACKGROUND

Many modern day electronic devices contain electronic memory configured to store data. Electronic memory may be volatile memory or non-volatile memory. Volatile memory stores data when it is powered, while non-volatile memory is able to store data when power is removed. Resistive random access memory (RRAM) is one promising candidate for next generation non-volatile memory technology due to its simple structure and its compatibility with CMOS logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3E illustrate some embodiments of operations of a memory array including a plurality of bit-line stacks disposed at an asymmetric pitch.

DETAILED DESCRIPTION

Figure 1A:
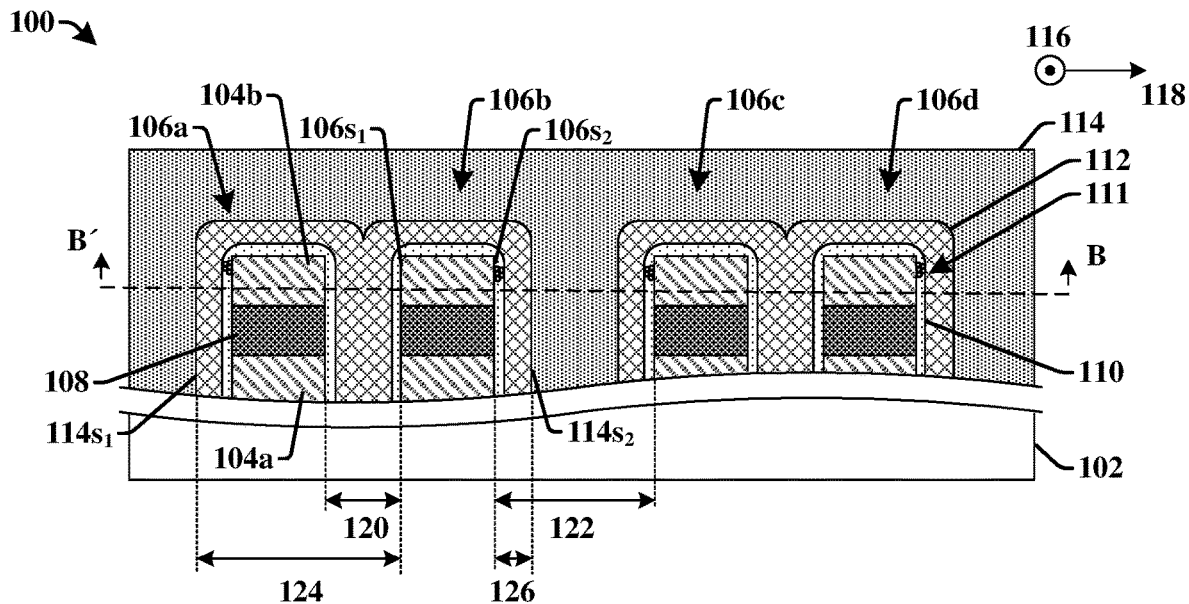
FIGS. 1A-1B illustrate some embodiments of an integrated circuit having a memory array including a plurality of bit-line stacks disposed at an asymmetric pitch.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) devices are configured to store data by switching between a high resistive state corresponding to a first data state (e.g., a "0") and a low resistive state corresponding to a second data state (e.g., a "1"). To enable such 'resistive switching,' RRAM devices have a lower electrode that is separated from an upper electrode by a data storage structure having a variable resistance. For example, a resistance of a data storage structure may be determined by the presence of a conductive filament comprising a plurality of oxygen vacancies within the data storage structure. If a conductive filament is not present, the data storage structure has a relatively high resistance associated with the first data state. If a conductive filament is present, the data storage structure has a relatively low resistance associated with the second data state. To change between data states, one or more applied bias voltages may move oxygen vacancies into or out of a data storage structure to form or break a conductive filament.

RRAM devices are typically arranged within an array in rows and/or columns. The array is coupled to control circuitry by way of a plurality of bit-lines and a plurality of word-lines. The plurality of bit-lines may be disposed in bit-line stacks, which comprise multiple bit-lines stacked onto one another. The bit-line stacks are arranged at a periodic and substantially even spacing over a substrate. The bit-line stacks can be covered by a data storage structure that extends along opposing sides and an upper surface of the bit-line stacks to define RRAM devices along sides of the bit-lines. A selector is disposed over the data storage structure and a word-line is disposed over the selector, such that the word-line is separated from opposing sides of a bit-line stack by the both the data storage structure and the selector. The selector is configured to control access to the RRAM devices by controlling a flow of current between the word-line and a bit-line.

During operation of such a memory array, data may be stored in the RRAM devices by applying a potential difference between a word-line and a bit-line to form a conductive filament between the word-line and bit-line. However, it has been appreciated that because the word-line is disposed along opposing sides of a bit-line, conductive filaments may form within the data storage structure along one or both sides of the bit-line. Because the conductive filaments may form within the data storage structure along one or both sides of a bit-line, variations in the number, size, and/or locations of conductive filaments can arise between different RRAM devices. This may lead to variations of electrical resistance in different RRAM devices. The variations of electrical resistance can degrade a read window of the RRAM devices within the memory array, thereby negatively impacting performance of the memory array.

The present disclosure, in some embodiments, relates to an integrated circuit (e.g., an integrated chip) comprising a memory array having a plurality of bit-line stacks disposed at an asymmetric pitch (e.g., a plurality of bit-line stacks having opposing sides that are separated from adjacent bit-line stacks by different distances). A data storage structure is disposed over the plurality of bit-line stacks, a selector is disposed over the data storage structure, and a word-line is disposed over the selector. The word-line separates a first side of a respective one of the plurality of bit-line stacks from a closest neighboring bit-line stack without separating an opposing second side of the bit-line stack from a closest neighboring bit-line stack, so that the plurality of bit-line stacks respectively have a first side that is laterally separated from the word-line by a smaller distance than an opposing second side. Because the first side of a bit-line stack is laterally separated from the word-line by a smaller distance than the opposing second side, a conductive filament will be consistently formed along the first side of the bit-line stack and variations in a number, size, and/or location of conductive filaments between different bit-lines can be reduced, thereby improving performance of an RRAM device within a memory array.

Figure 1B:
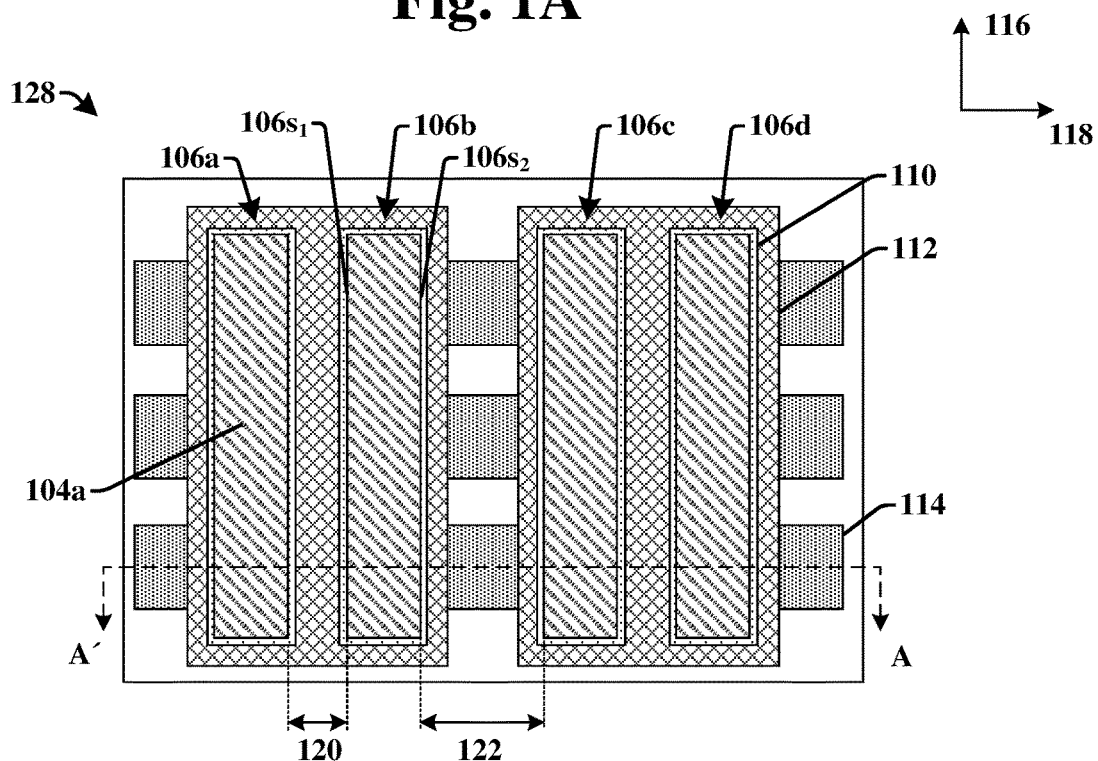

FIGS. 1A-1B illustrate some embodiments of an integrated circuit (e.g., an integrated chip) having a memory array including a plurality of bit-line stacks disposed at an asymmetric pitch. FIG. 1A illustrates a cross-sectional view 100 of the integrated circuit along line A-A' of a top-view 128 of the integrated circuit shown in FIG. 1B. FIG. 1B illustrates the top-view 128 of the integrated circuit along line B-B' of the cross-sectional view 100 shown in FIG. 1A.

As shown in the cross-sectional view 100 of FIG. 1A, the integrated circuit comprises a plurality of bit-line stacks 106a-106b disposed over a substrate 102. As shown in top-view 128 of FIG. 1B, the plurality of bit-line stacks 106a-106b extend over the substrate 102 along a first direction 116 and are laterally separated from one another along a second direction 118 that is perpendicular to the first direction 116. As shown in the cross-sectional view 100 of FIG. 1A, the plurality of bit-line stacks 106a-106b may respectively comprise two or more bit-lines 104a-104b stacked onto one another and separated by a dielectric material 108. For example, in some embodiments, a first bit-line stack 106a may comprise a first bit-line 104a separated from a second bit-line 104b by the dielectric material 108. In some additional embodiments (not shown), the first bit-line stack 106a may comprise additional bit-lines (e.g., a third bit-line separated from the second bit-line by a dielectric material, etc.).

A data storage structure 110 is disposed over the plurality of bit-line stacks 106a-106b, a selector 112 is disposed over the data storage structure 110, and a word-line 114 is disposed over the selector 112. During operation, voltages may be applied to bit-lines within the plurality of bit-line stacks 106a-106b and/or to the word-line 114. The voltages form a potential difference across the selector 112 and the data storage structure 110. If the potential difference between the word-line 114 and a bit-line is sufficiently large, the selector 112 may be configured to allow a current to flow across the data storage structure 110 at a location between the word-line 114 and the bit-line. The current can be used to read data from the data storage structure 110 or to write data to the data storage structure 110.

The plurality of bit-lines stacks 106a-106d are disposed in an asymmetric architecture, such that opposing sides of respective ones of the plurality of bit-lines stacks 106a-106d are separated from closest neighboring bit-line stacks on opposing sides by different distances. For example, the plurality of bit-line stacks 106a-106d may include a first bit-line stack 106a, a second bit-line stack 106b, and a third bit-line stack 106c. The second bit-line stack 106b has a first side $106s_1$ separated from a first bit-line stack 106a by a first distance 120 and a second side $106s2$ separated from a third bit-line stack 106c by a second distance 122 that is larger than the first distance 120. In some embodiments, the data storage structure 110 and/or the selector 112 completely fill a space between the first bit-line stack 106a and the second bit-line stack 106b, while a space between the second bit-line stack 106b and the third bit-line stack 106c is filled with the data storage structure 110, the selector 112, and the word-line 114.

In some embodiments, the word-line 114 comprises one or more lower surfaces that are completely vertically over and that continuously extend laterally past top surfaces of the first bit-line stack 106a and the second bit-line stack 106b. The word-line 114 further comprises a protrusion that extends outward from the one or more lower surfaces to directly between sides of the second bit-line stack 106b and the third bit-line stack 106c. In such embodiments, word-line 114 separates the second side $106s2$ of the second bit-line stack 106b from the third bit-line stack 106c without separating the first side $106s_1$ of the second bit-line stack 106b from the first bit-line stack 106b.

The protrusions define a first sidewall $114s_1$ of the word-line 114 that faces the first side $106s_1$ of the second bit-line stack 106b and that is separated from the first side $106s_1$ by a first distance 124. The protrusions further define a second sidewall $114s2$ of the word-line 114 that faces the second side $106s2$ of the second bit-line stack 106b and that is separated from the second side $106s2$ by a second distance 126 that is smaller than the first distance 124. Since the word-line 114 is closer to the second side $106s2$ of the second bit-line stack 106b than the first side $106s_1$ of the second bit-line stack 106b, a conductive filament 111 can be consistently formed along the second side $106s2$ of the second bit-line stack 106b without forming a conductive filament along the first side $106s_1$ of the second bit-line stack 106b. By consistently forming a conductive filament 111 along a single side of a plurality of bit-lines stacks 106a-106d, variations in a number, size, and/or location of conductive filaments between different bit-lines can be reduced, thereby improving performance of RRAM devices within the memory array.

Figure 2A:
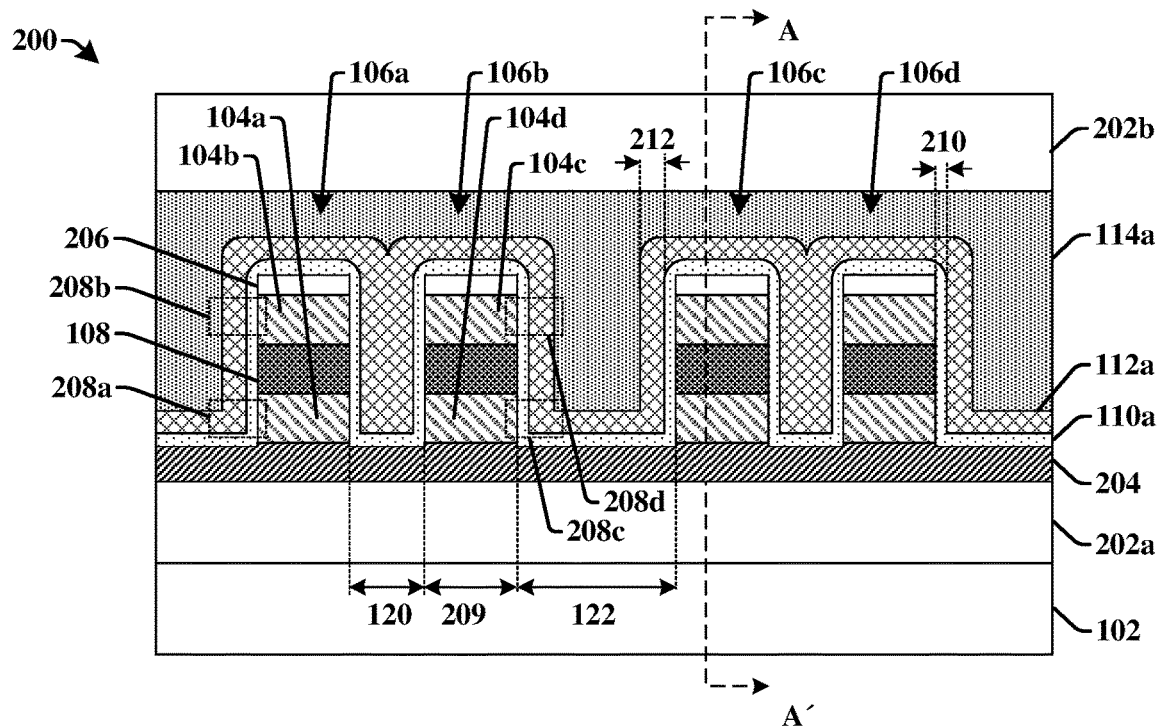
FIGS. 2A-2B illustrate cross-sectional views of some additional embodiments of an integrated circuit having a memory array including a plurality of bit-line stacks disposed at an asymmetric pitch.
Figure 2B:
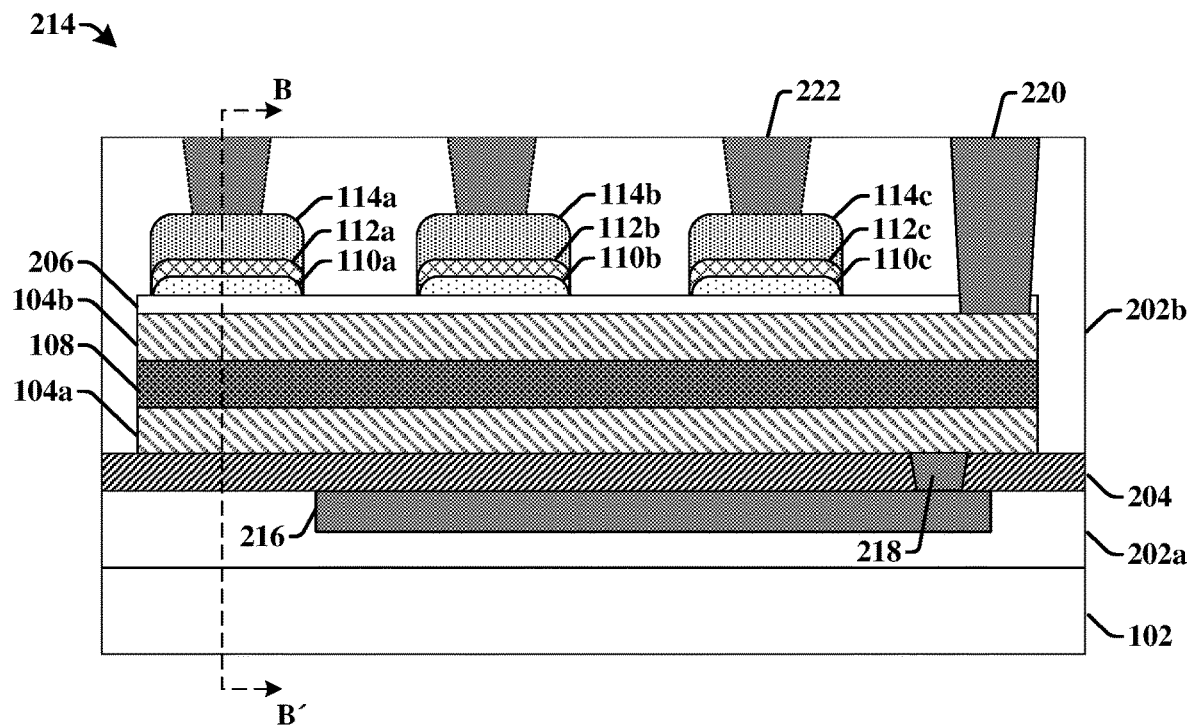

FIGS. 2A-2B illustrate cross-sectional views, 200 and 214, of some additional embodiments of an integrated circuit having a memory array including a plurality of bit-line stacks disposed at an asymmetric pitch.

As shown in cross-sectional view 200, the integrated circuit comprises a plurality of bit-line stacks 106a-106d disposed over a substrate 102. The plurality of bit-line stacks 106a-106d are laterally separated from one another. In some embodiments, the plurality of bit-line stacks 106a-106d may be vertically separated from the substrate 102 by way of a lower inter-level dielectric (ILD) layer 202a and by way of an etch stop layer 204 over the lower ILD layer 202a. In some embodiments, the etch stop layer 204 may comprise a nitride (e.g., silicon nitride), a carbide (e.g., silicon carbide), or the like.

The plurality of bit-lines stacks 106a-106d respectively comprise two or more bit-lines 104a-104b stacked onto one another and separated by a dielectric material 108. In some embodiments, a masking layer 206 may be disposed along a top of the plurality of bit-line stacks 106a-106b. In some embodiments, the bit-lines 104a-104b may comprise tungsten, aluminum, copper, doped polysilicon, or the like. In some embodiments, the dielectric material 108 may comprise an oxide, a nitride, or the like. In some embodiments, the masking layer 206 may comprise an oxide (SRO), a nitride (e.g., silicon nitride), a carbide (e.g., silicon carbide), or the like.

In some embodiments, the plurality of bit-line stacks 106a-106d may respectively have a width 209. In some embodiments, the width 208 may be in a range of between approximately 5 nm and approximately 25 nm. In some such embodiments, the asymmetric architecture of the plurality of bit-line stacks 106a-106d allows the plurality of bit-line stacks 106a-106d to be formed to a high density (e.g., a density that is higher than that achievable by constant pitch bit-line stacks). In other embodiments, the width 208 may be in a range of between approximately 10 nm and approximately 30 nm. In some such embodiments, the asymmetric architecture of the plurality of bit-line stacks 106a-106d enables the plurality of bit-line stacks 106a-106d to be formed at a greater width, so that the parasitic resistance of the plurality of bit-line stacks 106a-106d can be relatively low (e.g., lower than that achievable by constant pitch bit-line stacks) and a performance of an RRAM array can be improved. In yet other embodiments, the width 208 may have values that are greater than 30 nm or less than 5 nm.

In some embodiments, the plurality of bit-line stacks 106a-106d may comprise a first bit-line stack 106a, a second bit-line stack 106b, and a third bit-line stack 106c. The second bit-line stack 106b has a first side $106s_1$ separated from the first bit-line stack 106a by a first distance 120 and a second side $106s2$ separated from a third bit-line stack 106c by a second distance 122 that is larger than the first distance 120. In some embodiments, the first distance 120 is between approximately 200% and approximately 400% of the width 208. In some embodiments, the second distance 122 is between approximately 150% and approximately 200% of the first distance 120. In other embodiments, the second distance 122 may be larger than 150% or smaller than 200% of the first distance 120. In some embodiments, the first distance 120 may be in a range of between approximately 20 nm and approximately 40 nm, between approximately 10 nm and approximately 30 nm, between approximately 5 nm and approximately 20 nm, or other suitable values. In some embodiments, the second distance 122 may be in a range of between approximately 40 nm and approximately 60 nm, between approximately 30 nm and approximately 50 nm, between approximately 25 nm and approximately 40 nm, or other suitable values.

One or more data storage structures 110a-110c are disposed over the plurality of bit-line stacks 106a-106d, one or more selectors 112a-112c are disposed over the one or more data storage structures 110a-110c, and a plurality of word-lines 114a-114c are disposed over the one or more selectors 112a-112c. The one or more data storage structures 110a-110c define a plurality of RRAM devices 208a-208d, which are configured to respectively store a data state along a single side of a bit-line that is closest to a corresponding word-line. For example, the data storage structure 110a between the first bit-line 104a and a first word-line 114a defines a first RRAM device 208a configured to store a first data state, the data storage structure 110a between the second bit-line 104b and the first word-line 114a defines a second RRAM device 208b configured to store a second data state, etc.

In some embodiments, the plurality of word-lines 114a-114c extend from over the second bit-line stack 106b to directly between the second bit-line stack 106b and the third bit-line stack 106c, but not between the first bit-line stack 106a and the second bit-line stack 106b. In such embodiments, the data storage structure 110a directly between the second bit-line stack 106b and the third bit-line stack 106c is configured to store a data state (e.g., a conductive filament may be selectively formed between the second bit-line stack 106b and the third bit-line stack 106c), while the data storage structure 110a directly between the first bit-line stack 106a and the second bit-line stack 106b is not configured to store a data state (e.g., no conductive filaments may be formed between the first bit-line stack 106a and the second bit-line stack 106b).

In various embodiments, the plurality of word-lines 114a-114c may comprise doped polysilicon, or a metal, such as aluminum, titanium, tungsten, cobalt, or the like. In some embodiments, the one or more data storage structures 110a-110c, the one or more selectors 112a-112c, and the plurality of word-lines 114a-114c may continuously extend over the plurality of bit-lines stacks 106a-106d. As shown in cross-sectional view 214 of FIG. 2B, in some embodiments the one or more data storage structures 110a-110c, the one or more selectors 112a-112c, and plurality of word-lines 114a-114c may be discontinuous over the plurality of bit-line stacks 106a-106d along a second direction that is perpendicular to the first direction. In other embodiments (not shown), the plurality of word-lines 114a-114c may be discontinuous over the plurality of bit-line stacks 106a-106d along the second direction, while a data storage structure and a selector may extend continuously over the plurality of bit-line stacks 106a-106d.

In some embodiments, the one or more data storage structures 110a-110c may comprise a high-k dielectric layer. For example, the one or more data storage structures 110a-110c may comprise hafnium dioxide ($HfO_2$), zirconium dioxide ($ZrO_2$), aluminum oxide ($Al_2O_3$), tantalum pentoxide ($Ta_2O_5$), hafnium aluminum oxide (HfAlO), hafnium zirconium oxide (HfZrO), or the like. In other embodiments, the one or more data storage structures 110a-110c may comprise a phase change memory layer comprising a chalcogenide material such as GST (e.g., $Ge_2Sb_2Te_5$), N-doped GST, Si doped GST, InGeSbTe, doped arsenic (As), doped carbon (C) or the like. In yet other embodiments, the one or more data storage structures 110a-110c may comprise a magnetic tunnel junction, a ferroelectric material, or the like. In various embodiments, the one or more data storage structures 110a-110c may have a thickness 210 that is between approximately 5 nm and approximately 10 nm, between approximately 10 nm and approximately 20 nm, between approximately 20 nm and approximately 40 nm, or other suitable values.

In some embodiments, the one or more selectors 112a-112c may comprise one or more materials that are configured to have an electrical response that is similar to a diode (e.g., PN diode, PiN diode, Schottky diode, oxide semiconductor-oxide diode, or the like). In such embodiments, the one or more selectors 112a-112c have a threshold voltage that, if exceeded, allows current to flow through the selector 112, while if an applied voltage is less than the threshold voltage the one or more selectors 112a-112c block current from flowing. Because the one or more selectors 112a-112c are configured to selectively block current from flowing through an RRAM device, the one or more selectors 112a-112c are configured to selectively provide access to an RRAM device, in contrast to 1T1R or 1T2R architectures that utilize a transistor to selectively provide access to an RRAM device.

In some embodiments, the one or more selectors 112a-112c may comprise a threshold type selector (e.g., an ovonic threshold switch (OTS)). In some such embodiments, the one or more selectors 112a-112c may comprise a binary material (e.g., SiTe, GeTe, CTe, BTe, ZnTe, AlTe, or the like), a ternary material (e.g., GeSeAs, GeSeSb, GeSbTe, GeSiAs, or the like), and/or a quaternary material (e.g., GeSeAsTe, GeSeTeSi, GeSeTeAs, or the like). In other embodiments, the one or more selectors 112a-112c may comprise a voltage conductive bridge (VCB) selector. In some such embodiments, the one or more selectors 112a-112c may respectively comprise layers of Ag and HfO2, layers of Cu and HfO2, layers of Al and SiO2, layers of Ag and TaO2, or the like. In other embodiments, the one or more selectors 112a-112c may comprise an exponential type selector comprising TiO2, Ta2O5. NiO, layers of TiN and Si, or the like. In some embodiments, the one or more selectors 112a-112c may comprise a threshold type selector and an overlying exponential type selector stacked onto one another. In yet other embodiments, the one or more selectors 112a-112c may comprise a filament based selector, rectifier, varistor-type selector, doped-chalcogenide-based selector, Mott effect based selector, mixed-ionic-electronic-conductive (MIEC)-based selector, field-assisted-superliner-threshold (FAST) selector, a voltage conductive bridge (VCB) selector, an exponential type selector, or the like. In various embodiments, the one or more selectors 112a-112c may have a thickness 212 that is between approximately 10 nm and approximately 20 nm, between approximately 20 nm and approximately 40 nm, or other suitable values.

In some embodiments, the bit-lines within the plurality of bit-line stacks 106a-106c may be coupled to interconnect layers to enable connections to support circuitry (e.g., decoders, sense amplifiers, etc.). For example, in some embodiments the first bit-line 104a within the first bit-line stack 106a may be coupled to an underlying interconnect wire 216 by way of a first conductive via 218 extending through the etch stop layer 204. In some embodiments, the second bit-line 104b within the first bit-line stack 106a may be coupled to a second conductive via 220 that extends through the masking layer 206. Similarly, in some embodiments the plurality of word-lines 114a-114c may be coupled to overlying conductive vias 222.

FIGS. 3A-3E illustrate some embodiments of operations of a memory array including a plurality of bit-line stacks disposed at an asymmetric pitch.

FIGS. 3A-3B illustrate cross-sectional views, 300 and 302, of a memory array having a plurality of RRAM devices 208a-208d. The memory array comprises a plurality of word-lines 114a-114b separated from a plurality of bit-line stacks 106a-106b by a data storage structure 110 and a selector 112. To access one of the plurality of RRAM devices 208a-208d, a bit-line voltage is applied to a corresponding bit-line and a word-line voltage is applied to a corresponding word-line.

Figure 3C:
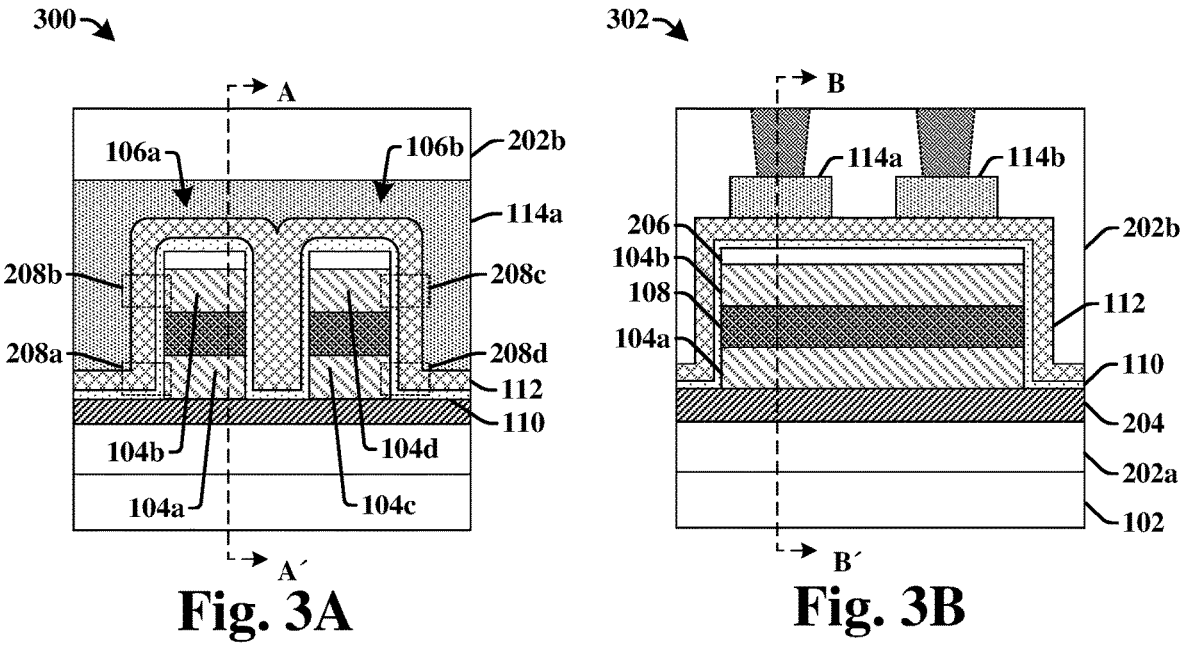
Figure 3C:
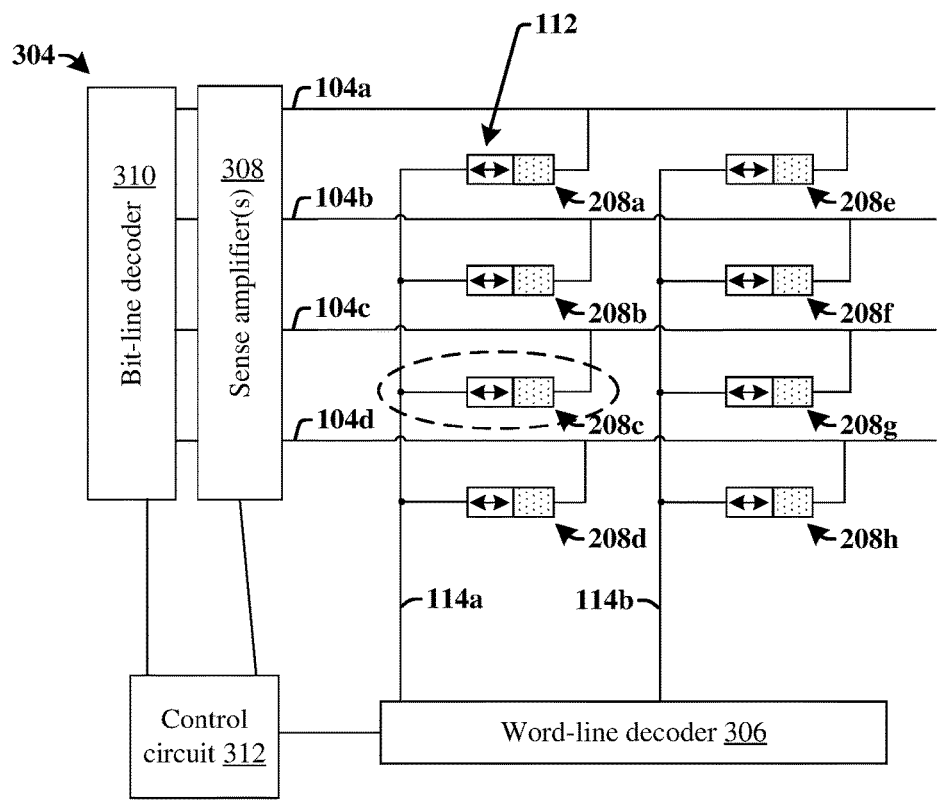

FIG. 3C illustrates a schematic diagram 304 of the memory array of FIGS. 3A-3B showing some embodiments of exemplary bias voltages applied to word-lines and bit-lines during read, write (e.g., set or reset), and/or forming operations.

The schematic diagram 304 comprises a plurality of RRAM devices 208a-208h. A plurality of word-lines 114a-114b are coupled to a word-line decoder 306 and a plurality of bit-lines 104a-104d are coupled to a sense amplifier 308 and to a bit-line decoder 310. In some embodiments, a control circuit 312 is coupled to the word-line decoder 306, the sense amplifier 308, and/or the bit-line decoder 310. The plurality of word-lines 114a-114b are respectively coupled to a first terminal of the plurality of RRAM devices 208a-208h by way of a selector 112. The plurality of bit-lines 104a-104d are respectively coupled to a second terminal of the plurality of RRAM devices 208a-208h. An activated RRAM device 208c is coupled to a first word-line 114a and to a third bit-line 104c.

To perform a read operation that reads data from the activated RRAM device 208c, the word-line decoder 306 is configured to apply a voltage $V_1$ to the first word-line 114a and a voltage of ⅓ the voltage (i.e., $V_1/3$) to a second word-line 114b. The bit-line decoder 310 is concurrently configured to apply a voltage of substantially zero to the third bit-line 104c and a voltage of ⅔ the voltage (i.e., $2V_1/3$) to the first bit-line 104a, the second bit-line 104b, and the fourth bit-line 104d. In some embodiments, the voltage $V_1$ may be in a range of between approximately 0.8 volts and approximately 1.0 volt for the read operation.

The selector 112 has a threshold voltage that, if exceeded, allows current to flow through the selector 112. In some embodiments, the threshold voltage may be approximately equal to 0.7V. In other embodiments, the threshold voltage may have other values (e.g., 0.5V, 0.9V, or other suitable values). If an applied voltage is less than the threshold voltage, the selector 112 blocks current from flowing through the selector 112. Therefore, a difference between the voltage $V_1$ and the substantially zero voltage is sufficiently high (e.g., is greater than a threshold voltage of the selector 112) to cause a first current to flow from the first word-line 114a to the third bit-line 104c and through selector 112 and the activated RRAM device 208c. A difference between ⅓ the voltage (i.e., $V_1/3$) and the substantially zero voltage is too low (e.g., is less than a threshold voltage of the selector 112) to cause a current to flow from the second word-line 114b to the third bit-line 104c and through non-activated RRAM device 208g. Similarly, differences between the voltage $V_1$ and ⅔ the voltage (i.e., $2V_2/3$) and between ⅓ the voltage (i.e., $V_1/3$) and ⅔ the voltage (i.e., $V_1/3$) are too low (e.g., less than a threshold voltage of the selector 112) to cause a current to flow through non-activated ones of the plurality of RRAM devices (e.g., 208a-208b, 208d-208f, and 208h).

To perform a set operation that writes a first data state (e.g., a logical "1") to the activated RRAM device 208c, the word-line decoder 306 is configured to apply a voltage $V_1$ to the first word-line 114a and a voltage of ⅓ the voltage (i.e., $V_1/3$) to a second word-line 114b. The bit-line decoder 310 is configured to concurrently apply a voltage of substantially zero to the third bit-line 104c and a voltage of ⅔ the voltage (i.e., $2V_1/3$) to the first bit-line 104a, the second bit-line 104b, and the fourth bit-line 104d. In some embodiments, the voltage $V_1$ may be in a range of between approximately 1.2 volts and approximately 1.5 volts for the set operation.

A difference between the voltage $V_1$ and the substantially zero voltage is sufficiently high (e.g., is greater than a threshold voltage of the selector 112) to cause a first current to flow from the first word-line 114a to the third bit-line 104c and through selector 112 and the activated RRAM device 208c. The first current drives oxygen vacancies into activated RRAM device 208c to form a conductive filament within the activated RRAM device 208c. Forming the conductive filament within the activated RRAM device 208c writes the first data state (e.g., a logical "1") to the activated RRAM device 208c by providing the activated RRAM device 208c with a first resistance (e.g., a low resistance) corresponding to the first data state. A difference between ⅓ the voltage (i.e., $V_1/3$) and the substantially zero voltage is too low (e.g., is less than a threshold voltage of the selector 112) to cause a current to flow from the second word-line 114b to the third bit-line 104c and through non-activated RRAM device 208g. Similarly, differences between the voltage $V_1$ and ⅔ the voltage (i.e., $2V_1/3$) and between ⅓ the voltage (i.e., $V_1/3$) and ⅔ the voltage (i.e., $2V_1/3$) are too low (e.g., less than a threshold voltage of the selector 112) to cause a current to flow through non-activated ones of the plurality of RRAM devices (e.g., 208a-208b, 208d-208f, and 208h).

To perform a reset operation that writes a second data state (e.g., a logical "0") to the activated RRAM device 208c, the word-line decoder 306 is configured to apply a voltage of substantially zero to the first word-line 114a and a voltage of ⅔ the voltage (i.e., $2V_1/3$) to a second word-line 114b. The bit-line decoder 310 is configured to concurrently apply the voltage $V_1$ to the third bit-line 104c and a voltage of ⅔ the voltage (i.e., $V_1/3$) to the first bit-line 104a, the second bit-line 104b, and the fourth bit-line 104d. In some embodiments, the voltage $V_1$ may be in a range of between approximately 1.2 volts and approximately 1.5 volts for the reset operation.

A difference between the voltage $V_1$ and the substantially zero voltage is sufficiently high (e.g., is greater than a threshold voltage of the selector 112) to cause a first current to flow from the third bit-line 104c to the first word-line 114a and through selector 112 and the activated RRAM device 208c. The first current drives oxygen vacancies out of the activated RRAM device 208c to break a conductive filament within the activated RRAM device 208c. Breaking the conductive filament within the activated RRAM device 208c writes the second data state (e.g., a logical "0") to the activated RRAM device 208c by providing the activated RRAM device 208c with a second resistance corresponding to the second data state. A difference between ⅔ the voltage (i.e., $2V_1/3$) and the voltage is too low (e.g., is less than a threshold voltage of the selector 112) to cause a current to flow from the third bit-line 104c to the second word-line 114b and through non-activated RRAM device 208g. Similarly, differences between ⅓ the voltage (i.e., $V_1/3$) and the voltage $V_1$ and between ⅔ the voltage (i.e., $2V_1/3$) and the voltage $V_1$ are too low (e.g., less than a threshold voltage of the selector 112) to cause a current to flow through non-activated ones of the plurality of RRAM devices (e.g., 208a-208b, 208d-208f, and 208h).

To perform a forming operation that forms an initial conductive filament within the activated RRAM device 208c, the word-line decoder 306 is configured to apply a voltage $V_1$ to the first word-line 114a and a voltage of ⅓ the voltage (i.e., $V_1/3$) to a second word-line 114b. The bit-line decoder 310 is configured to concurrently apply a voltage of substantially zero to the third bit-line 104c and a voltage of ⅔ the voltage (i.e., $2V_1/3$) to the first bit-line 104a, the second bit-line 104b, and the fourth bit-line 104d. In some embodiments, the voltage $V_1$ may be in a range of between approximately 1.8 volts and approximately 2.0 volts for the forming operation.

A difference between the voltage $V_1$ and the substantially zero voltage is sufficiently high (e.g., is greater than a threshold voltage of the selector 112) to cause a first current to flow from the first word-line 114a to the third bit-line 104c and through selector 112 and the activated RRAM device 208c. The first current drives oxygen vacancies into activated RRAM device 208c to form an initial conductive filament within the activated RRAM device 208c. A difference between ⅓ the voltage (i.e., $V_1/3$) and the substantially zero voltage is too low (e.g., is less than a threshold voltage of the selector 112) to cause a current to flow from the second word-line 114b to the third bit-line 104c and through non-activated RRAM device 208g. Similarly, differences between the voltage $V_1$ and ⅔ the voltage (i.e., $2V_1/3$) and between ⅓ the voltage (i.e., $V_1/3$) and ⅔ the voltage (i.e., $2V_1/3$) are too low (e.g., less than a threshold voltage of the selector 112) to cause a current to flow through non-activated ones of the plurality of RRAM devices (e.g., 208a-208b, 208d-208f, and 208h).

FIG. 3D illustrates a graph 306 showing some embodiments of exemplary voltages that can be applied to word-lines and bit-lines within a disclosed memory array to perform read, write (e.g., set and reset), and forming operations. It will be appreciated that the voltages in graph 306 are non-limiting examples of voltages that may be used in read, write (e.g., set and reset), and forming operations, and that in alternative embodiments other voltages may be used.

FIG. 3E illustrates a flow diagram of a method 308 of operating a disclosed RRAM device. It will be appreciated that the disclosed method 308 may be applied to read operations, write (e.g., set or reset) operations, or forming operations by using values of the voltages described in relation to FIGS. 3C and 3D.

At 310, a first voltage is applied to a first word-line that is coupled to a first RRAM device through a first selector having a first threshold voltage and to a second RRAM device through a second selector having a second threshold voltage.

At 312, a second voltage, which is different than the first voltage, is applied to a second word-line that is coupled to a third RRAM device through a third selector having a third threshold voltage and to a fourth RRAM device through a fourth selector having a fourth threshold voltage.

A 314, a third voltage is applied to a first bit-line that is coupled to the first RRAM device and to the third RRAM device. A difference between the first voltage and third voltage is greater than the first threshold voltage, so that application of the third voltage causes a current to flow through the first selector along a single side of the first bit-line (e.g., along a first side of the first bit-line and not along an opposing second side of the first bit-line). During a write operation, the current may cause a filament to form or break along the single side of the first bit-line. A difference between the second voltage and the third voltage is less than a third threshold voltage, so that application of the third voltage does not cause a current to flow through the third selector.

A 316, a fourth voltage is applied to a second bit-line that is coupled to the second RRAM device and to the fourth RRAM device. Differences between the first voltage and the fourth voltage and between the second voltage and the fourth voltage are less than the second and fourth threshold voltages, so that application of fourth voltage does not cause a current to flow through the second and fourth selectors.

It will be appreciated that during a read operation, the disclosed memory array may be operated to read multiple data states in parallel. FIGS. 4A-5B illustrate various embodiments of read operations on a disclosed memory array. In some embodiments, the number of data states that are read in parallel may depend upon available sense amplifiers. It will be appreciated that the read operations shown in FIGS. 4A-5B are exemplary read operations and that data may be read from a disclosed memory array in other ways not shown in FIGS. 4A-5B.

Figure 4A:
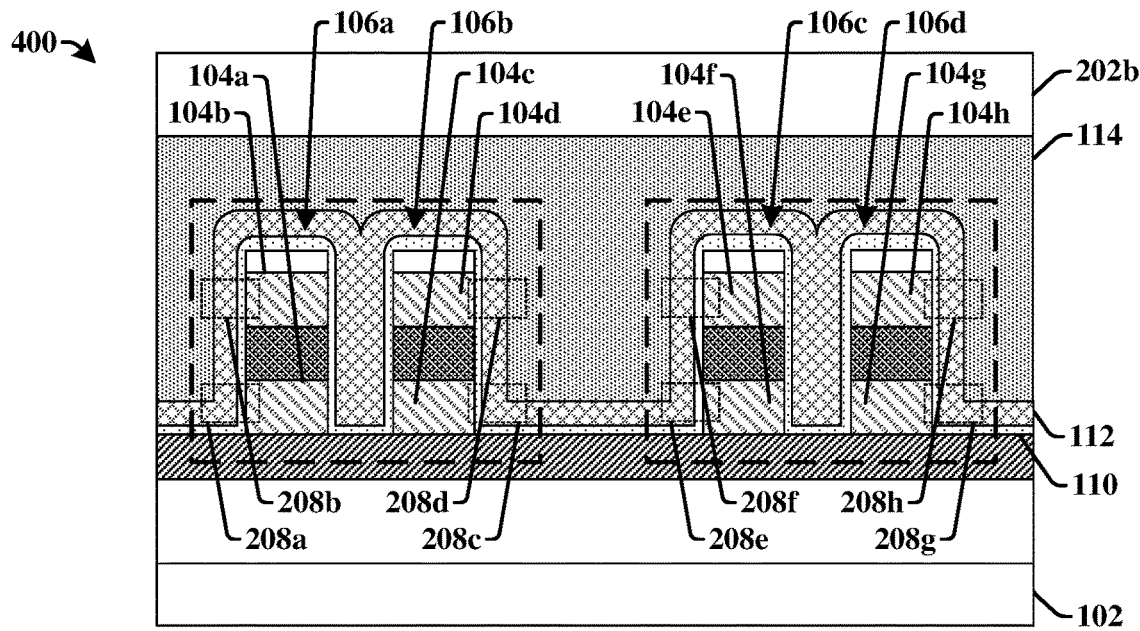
FIGS. 4A-4B illustrate some embodiments of a disclosed memory array operated to read four bits in parallel.
Figure 4B:
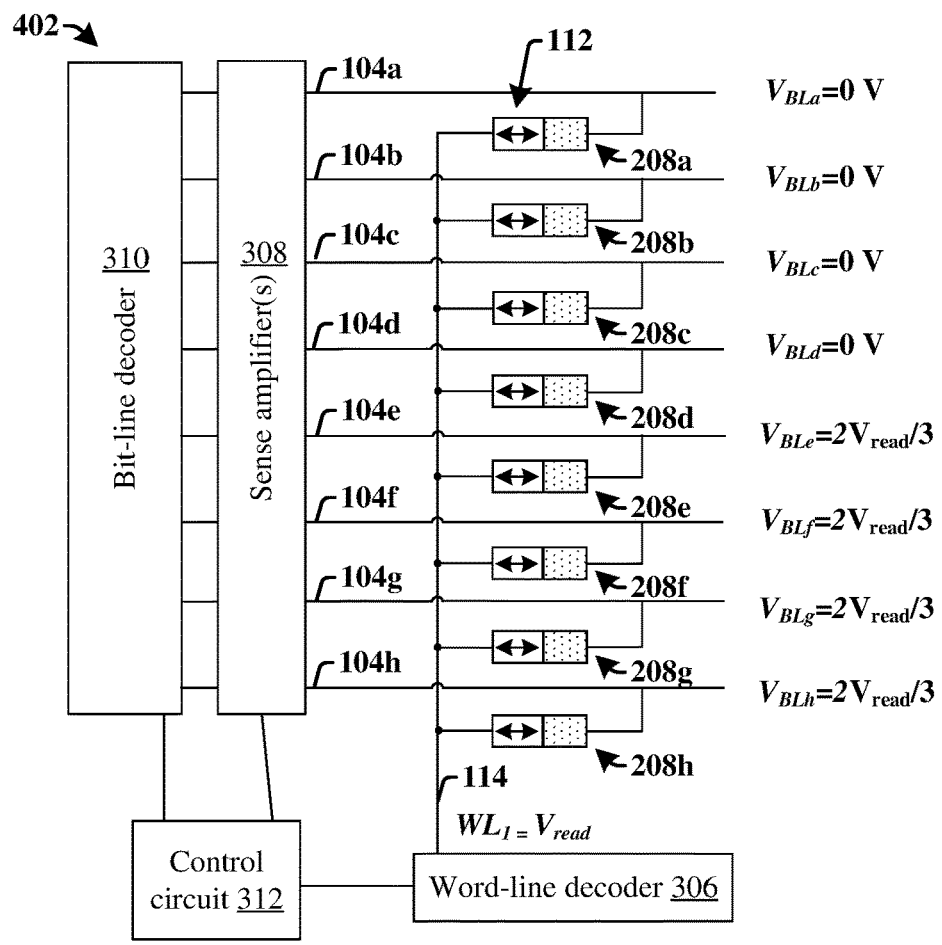

FIGS. 4A-4B illustrate some embodiments of a disclosed memory array operated to read four bits in parallel. It will be appreciated that the voltage values described in the operation of FIGS. 4A-4B are exemplary values and that other values may also be used in other embodiments.

FIG. 4A illustrates a cross-sectional view 400 of an integrated circuit having a memory array comprising a plurality of bit-line stacks 106a-106d respectively including two or more of a plurality of bit-lines 104a-104h. A selector 112 is disposed over the plurality of bit-line stacks 106a-106d, a data storage structure 110 is disposed over the selector 112, and a word-line 114 is disposed over the data storage structure 110.

FIG. 4B illustrates a schematic diagram 402 corresponding to the memory array of FIG. 4A. The schematic diagram 402 has a plurality of RRAM devices 208a-208h. The plurality of RRAM devices 208a-208h respectively comprise a first terminal operably coupled to a word-line 114 by way of a selector 112 and a second terminal coupled to one of a plurality of bit-lines 104a-104h. For example, a first RRAM device 208a is operably coupled to the word-line 114 by way of selector 112 and to a first bit-line 104a, a second RRAM device 208b is operable coupled to the word-line 114 by way of selector 112 and to a second bit-line 104b, etc.

To read data from four of the RRAM devices 208a-208d of the plurality of RRAM devices 208a-208h in parallel, a word-line decoder 306 is configured to selectively apply a read voltage $V_{read}$ to the word-line 114. Concurrently, a bit-line decoder 310 is configured to selectively apply a substantially zero voltage to bit-lines 104a-104d, and a voltage of ⅔ the read voltage ($2V_{read}/3$) to bit-lines 104e-104h. The voltages applied to bit-lines 104a-104d form potential differences across the selector 112 that are large enough to cause currents to flow through RRAM devices 208a-208d. The sense amplifier 308 is configured to receive the currents and to determine a data state within the RRAM devices 208a-208d from the currents. The voltages applied to bit-lines 104e-104h form potential difference across the selector 112 that are not large enough to cause currents to flow through RRAM devices 208e-208h.

Figure 5A:
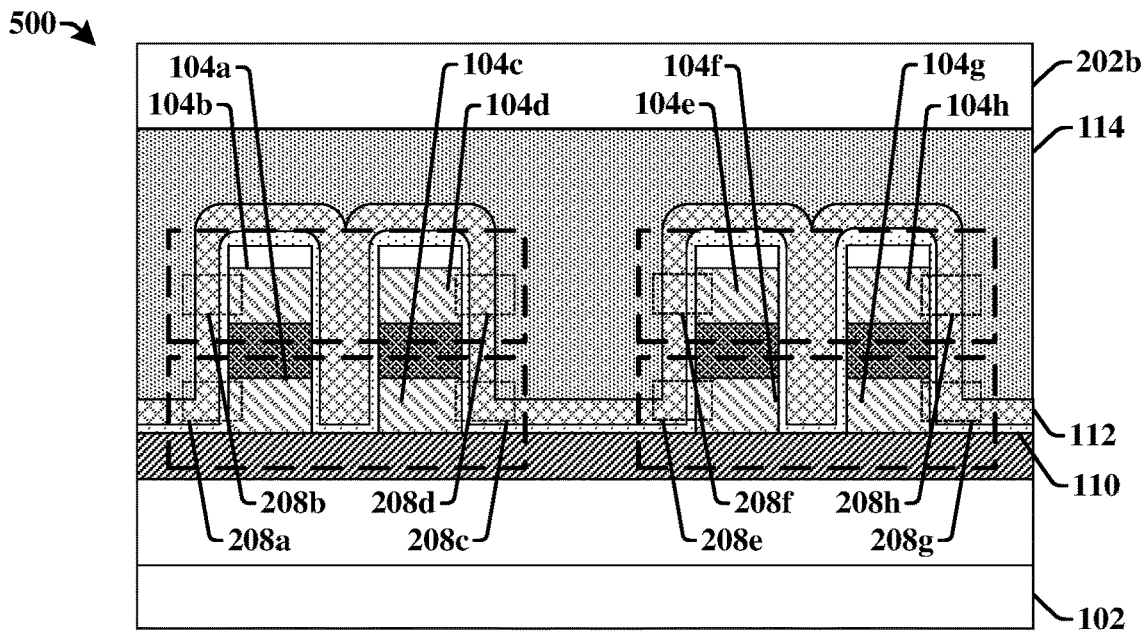
FIGS. 5A-5B illustrate some embodiments of a disclosed memory array operated to read two bits in parallel.
Figure 5B:
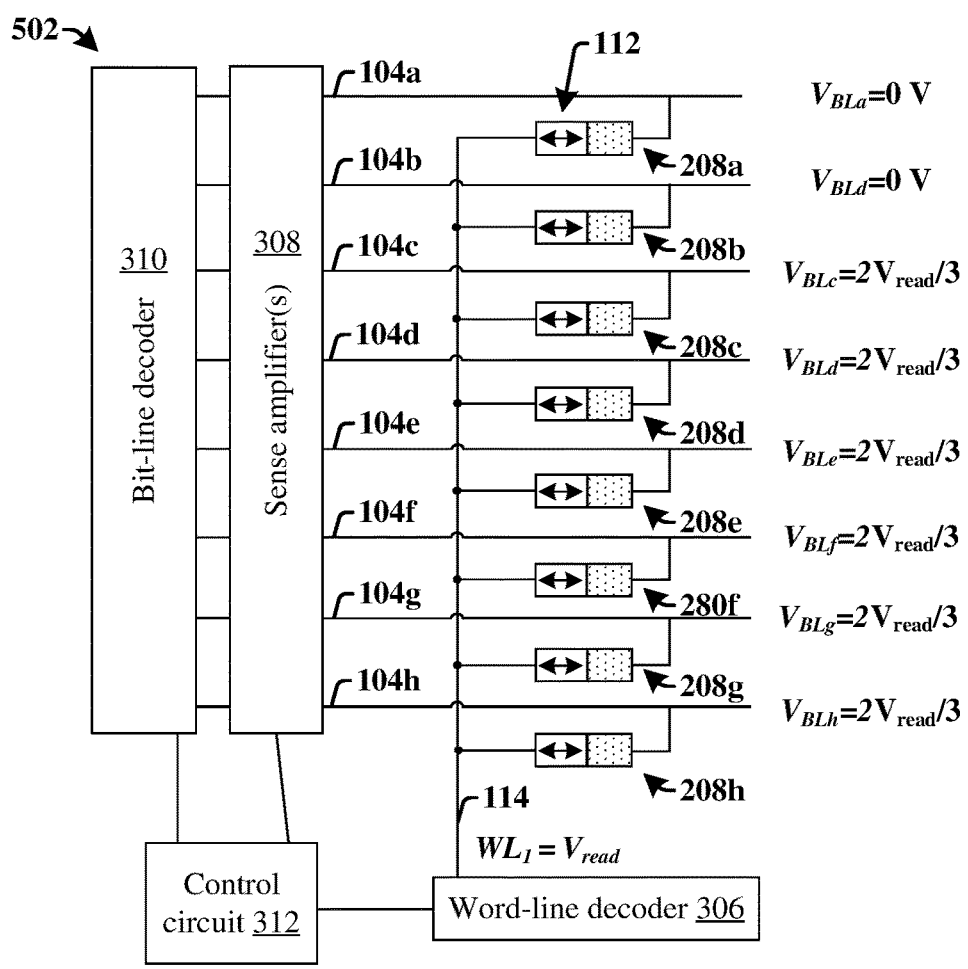

FIGS. 5A-5B illustrate some embodiments of a disclosed memory array operated to read two bits in parallel. It will be appreciated that the voltage values described in the operation of FIGS. 5A-5B are exemplary values and that other values may also be used in other embodiments.

FIG. 5A illustrates a cross-sectional view 500 of an integrated circuit having a memory array comprising a plurality of bit-line stacks 106a-106d respectively including two or more of a plurality of bit-lines 104a-104h. A selector 112 is disposed over the plurality of bit-line stacks 106a-106d, a data storage structure 110 is disposed over the selector 112, and a word-line 114 is disposed over the data storage structure 110.

FIG. 5B illustrates a schematic diagram 502 corresponding to the memory array of FIG. 5A. The schematic diagram 502 has a plurality of RRAM devices 208a-208h. The plurality of RRAM devices 208a-208h respectively comprise a first terminal operably coupled to a word-line 114 by way of a selector 112 and a second terminal coupled to one of a plurality of bit-lines 104a-104h. For example, a first RRAM device 208a is operable coupled to the word-line 114 by way of selector 112 and to a first bit-line 104a, a second RRAM device 208b is operable coupled to the word-line 114 by way of selector 112 and to a second bit-line 104b, etc.

To read data from two RRAM devices 208a-208b of the plurality of RRAM devices 208a-208h in parallel, the word-line decoder 306 is configured to selectively apply a read voltage $V_{read}$ to the word-line 114. Concurrently, the bit-line decoder 310 is configured to selectively apply a substantially zero voltage to bit-lines 104a-104b, and a voltage of ⅔ the read voltage ($2V_{read}/3$) to bit-lines 104c-104h. The voltages applied to bit-lines 104a-104b form a potential difference across selector 112 that is large enough to cause currents to flow through RRAM devices 208a-208b. The sense amplifier 308 is configured to receive the currents and to determine a data state within the RRAM devices 208a-208b from the currents. The voltages applied to bit-lines 104c-104h form a potential difference across selector 112 that is not large enough to cause currents to flow through RRAM devices 208c-208h.

Figure 6:
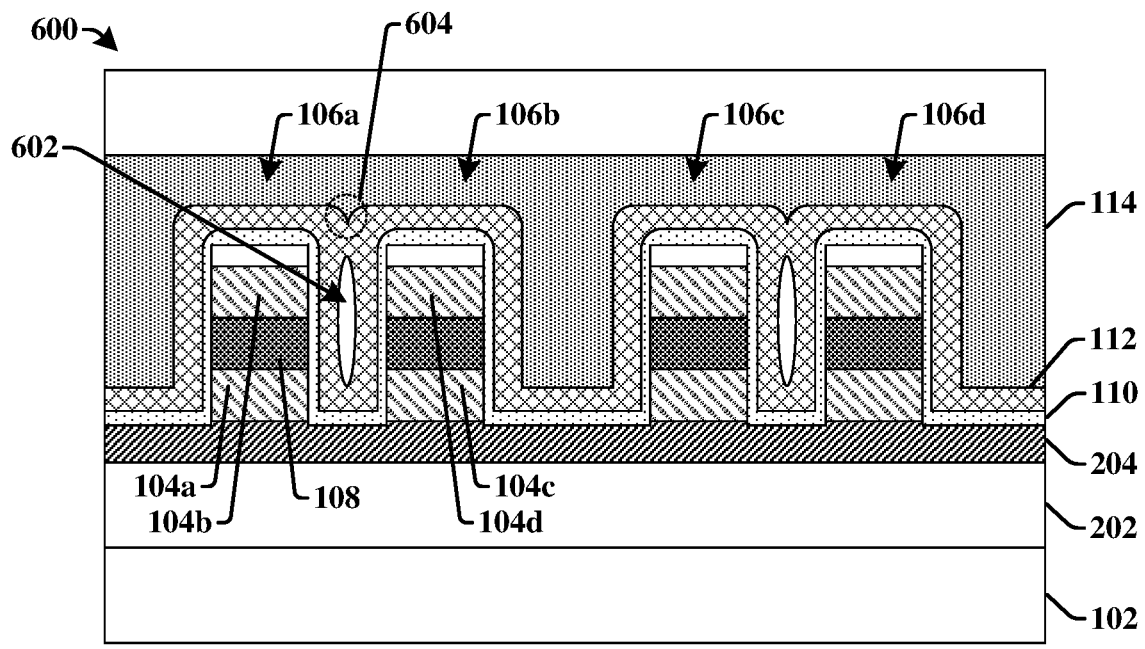
FIGS. 6-9 illustrate cross-sectional views of some additional embodiments of integrated circuits having a memory array including a plurality of bit-line stacks disposed at an asymmetric pitch.

FIG. 6 illustrates some additional embodiments of an integrated circuit 600 having a memory array including a plurality of bit-line stacks disposed at an asymmetric pitch.

The integrated circuit 600 comprises a plurality of bit-line stacks 106a-106d respectively comprising bit-lines 104a-104b separated by a dielectric material 108. A data storage structure 110 is disposed over the plurality of bit-line stacks 106a-106d, and a selector 112 is disposed over the data storage structure 110. The selector 112 comprises one or more interior surfaces that define a void 602 disposed directly between a first bit-line stack 106a and a second bit-line stack 106b. In some embodiments, the void 602 may have a width that is in a range of between approximately 10 nm and approximately 35 nm, between approximately 15 nm and approximately 25 nm, or other similar values. In some embodiments, the void 602 may have a height that extends past top and bottom surfaces of bit-line 104b. In some additional embodiments, the void 602 may have a height that extends past top and bottom surfaces of both bit-line 104b and dielectric material 108.

In some embodiments, the void 602 is directly between the first bit-line 104a and a third bit-line 104c and/or between a second bit-line 104b and a fourth bit-line 104d. The void 602 may be filled with a gas (e.g., air, nitrogen, helium, etc.). In some embodiments, the void 602 may be held at a pressure that is less than 1 atm. Because the gas within the void 602 has a low-dielectric constant, the void 602 may increase isolation between the first bit-line stack 106a and the second bit-line stack 106b. By increasing isolation between the first bit-line stack 106a and the second bit-line stack 106b, a distance between the first bit-line stack 106a and the second bit-line stack 106b can be made to be smaller, thereby decreasing a size of a memory array, without negatively impacting performance.

In some embodiments, the selector 112 may comprise an upper surface that has a divot 604 (i.e., a recess) arranged laterally between the first bit-line stack 106a and the second bit-line stack 106b. In some embodiments, the divot 604 has a bottom that is over the tops of the first bit-line stack 106a and the second bit-line stack 106b.

Figure 7:
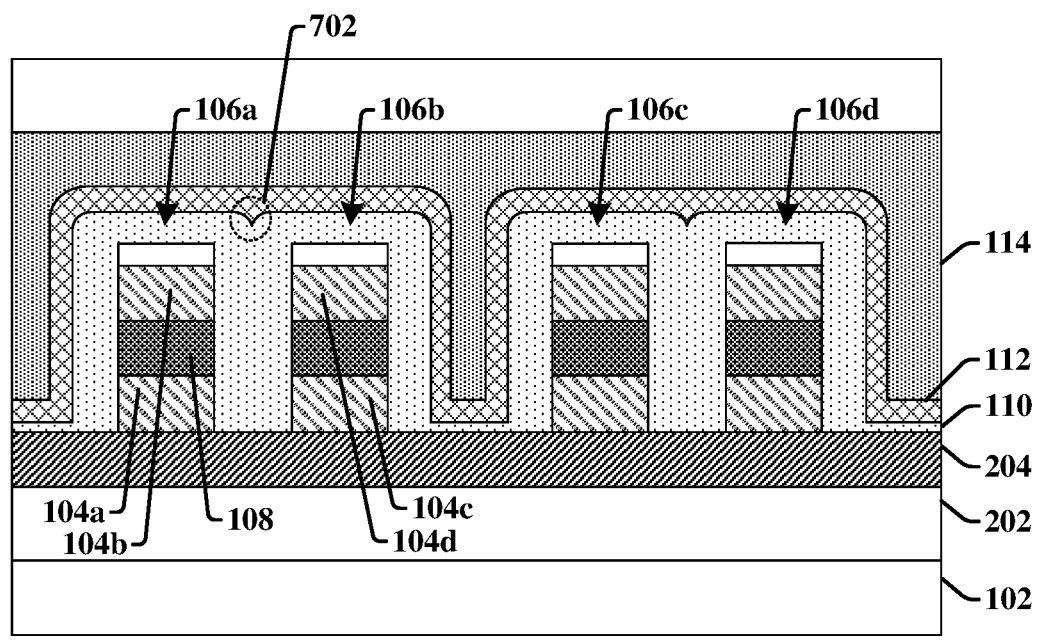

FIG. 7 illustrates some additional embodiments of an integrated circuit 700 having a memory array including a plurality of bit-line stacks disposed at an asymmetric pitch.

The integrated circuit 700 comprises a plurality of bit-line stacks 106a-106d respectively comprising bit-lines 104a-104b separated by a dielectric material 108. A data storage structure 110 is disposed over the plurality of bit-line stacks 106a-106d, and a selector 112 is disposed over the data storage structure 110. An upper surface of the data storage structure 110 is completely over tops of the first bit-line stack 106a and the second bit-line stack 106b along an entire distance between the first bit-line stack 106a and the second bit-line stack 106b.

In some embodiments, the upper surface of the data storage structure 110 may comprise a divot 702 arranged laterally between the first bit-line stack 106a and the second bit-line stack 106b. The divot 702 has a bottom that is over the tops of the first bit-line stack 106a and the second bit-line stack 106b.

Figure 8:
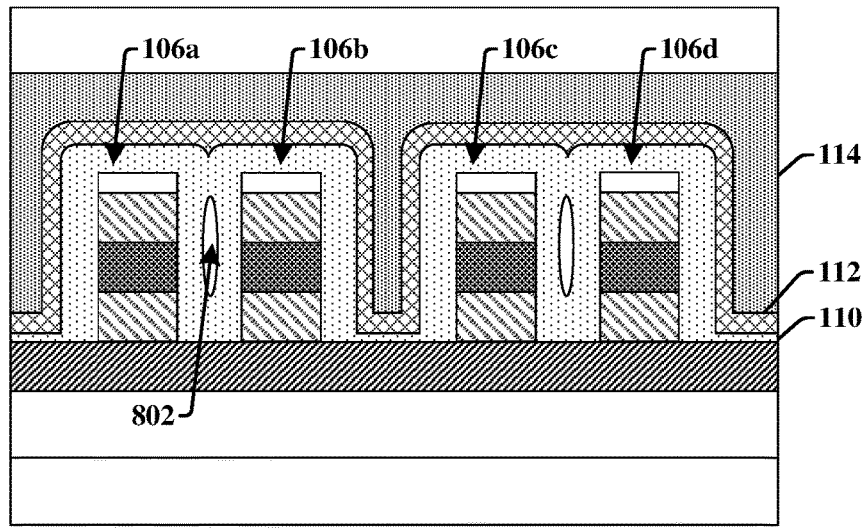

FIG. 8 illustrates some additional embodiments of an integrated circuit 800 having a memory array including a plurality of bit-line stacks disposed at an asymmetric pitch.

The integrated circuit 800 comprises a data storage structure 110 disposed over a plurality of bit-line stacks 106a-106d, and a selector 112 disposed over the data storage structure 110. The data storage structure 110 has an upper surface that is completely over tops of the first bit-line stack 106a and the second bit-line stack 106b. The upper surface continuously extends between a sidewall of a first bit-line stack 106a and a sidewall of a second bit-line stack 106b.

The data storage structure 110 comprises one or more interior surfaces that define a void 802 disposed between the first bit-line stack 106a and the second bit-line stack 106b. The void 802 may be filled with a gas (e.g., air, nitrogen, etc.). Because the gas within the void 802 has a low-dielectric constant, the void 802 may increase isolation between the first bit-line stack 106a and the second bit-line stack 106b.

Figure 9:
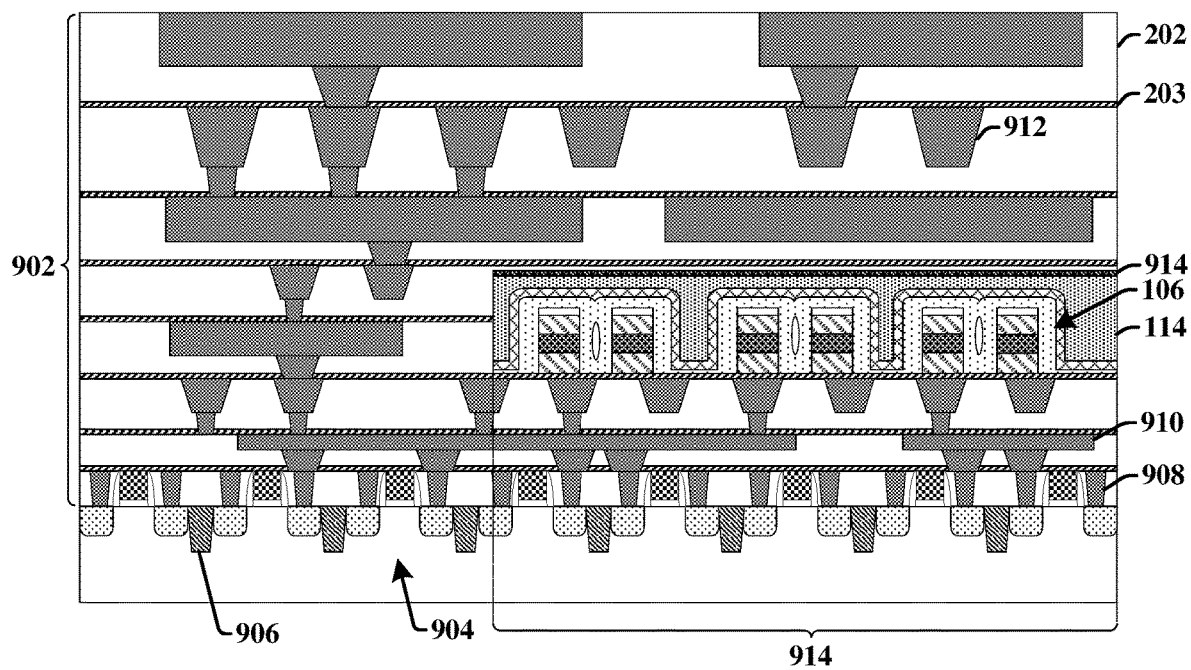

FIG. 9 some additional embodiments of an integrated circuit 900 having a memory array including a plurality of bit-line stacks disposed at an asymmetric pitch.

The integrated circuit 900 includes a dielectric structure 902 disposed over a substrate 102. The dielectric structure 902 comprises a plurality of stacked inter-level dielectric (ILD) layers 202. In some embodiments, the plurality of stacked ILD layers 202 may be vertically separated by etch stop layers 203. In some embodiments, the plurality of stacked ILD layers 202 may comprise one or more of silicon dioxide, SiCOH, a fluorosilicate glass, a phosphate glass (e.g., borophosphate silicate glass, etc.), or the like. In some embodiments, the etch stop layers 203 may comprise a nitride (e.g., silicon nitride), a carbide (e.g., silicon carbide), or the like.

A plurality of transistor devices 904 are disposed within the substrate 102. The plurality of transistor devices 904 may be laterally separated by isolation structures 906 disposed within the substrate 102. In some embodiments, the plurality of transistor devices 904 may comprise MOSFET devices. In other embodiments, the plurality of transistor devices 904 may comprise a bi-polar junction transistor (BJT), a high electron mobility transistor (HEMT), or the like. In some embodiments, the isolation structures 906 may comprise one or more dielectric materials disposed within trenches in the substrate 102.

A plurality of interconnect layers 908-912 are disposed within the dielectric structure 902. The plurality of interconnect layers 908-912 are electrically coupled to the plurality of transistor devices 904. In some embodiments, the plurality of interconnect layers 908-912 may comprise conductive contacts 908, interconnect wires 910, and interconnect vias 912.

An embedded memory region 914 is also disposed within the dielectric structure 902. The embedded memory region 914 comprises a plurality of bit-lines stacks 106. A word-line 114 extends over the plurality of bit-line stacks 106. In some embodiments a masking layer may be disposed over the word-line 114. In some embodiments, the plurality of bit-line stacks 106 may be vertically offset from (e.g., over and/or under) and laterally adjacent to one or more of the plurality of interconnect layers 908-912.

In some embodiments, the plurality of bit-line stacks 106 may be laterally offset from one or more of the plurality of interconnect layers 908-912. In some embodiments, the plurality of bit-line stacks 106 may respectively have angled sidewalls that cause a width of a bit-line stack to decrease as a distance from the substrate 102 increases. In some such embodiments, one or more of the laterally offset plurality of interconnect layers 908-912 may have angled sidewalls that cause a width of the interconnect layer to increase as a distance from the substrate 102 increases.

In some embodiments, the embedded memory region 914 may extend to directly over one or more of the plurality of transistor devices 904. In some embodiments, the plurality of transistor devices 904 below the embedded memory region 914 may be configured to act as support circuitry (e.g., a bit-line decoder, a word-line decoder, a sense amplifier, or the like) for the memory devices within the embedded memory region 914. In some embodiments, the plurality of transistor devices 904 below the embedded memory region 914 may be configured to perform logic operations that are not related to support circuitry of for memory devices within the embedded memory region 914.

FIGS. 10-22B illustrate some embodiments of a method of forming an integrated circuit having a memory array including a plurality of bit-line stacks disposed at an asymmetric pitch. Although FIGS. 10-22B are described in relation to a method, it will be appreciated that the structures disclosed in FIGS. 10-22B are not limited to such a method, but instead may stand alone as structures independent of the method.

Figure 10:
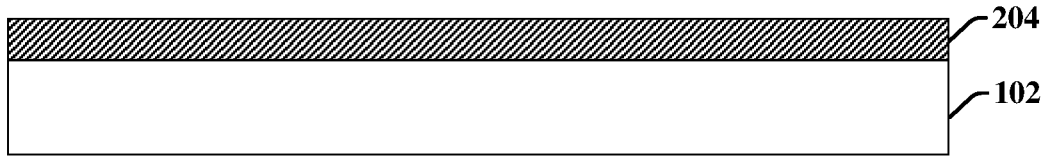
FIGS. 10-22B illustrate some embodiments of a method of forming an integrated circuit having a memory array including a plurality of bit-line stacks disposed at an asymmetric pitch.

As shown in cross-sectional view 1000 of FIG. 10, an etch stop layer 204 is formed over a substrate 102. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In various embodiments, the etch stop layer 204 may comprise an oxide (e.g., silicon rich oxide (SRO)), a nitride (e.g., silicon nitride), a carbide (e.g., silicon carbide), or the like. In some embodiments, the etch stop layer 204 may be formed by way of a deposition process (e.g., physical vapor deposition (PVD), chemical vapor deposition (CVD), PE-CVD, atomic layer deposition (ALD), etc.).

Figure 11:
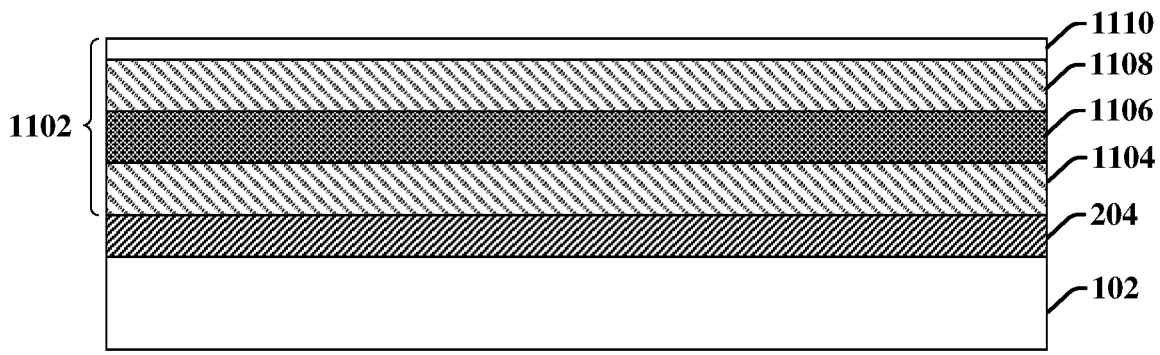

As shown in cross-sectional view 1100 of FIG. 11, a bit-line structure 1102 may be formed over the etch stop layer 204. The bit-line structure 1102 comprises a first bit-line layer 1104, a dielectric layer 1106 disposed over the first bit-line layer 1104, a second bit-line layer 1108 over the dielectric layer 1106, and a masking layer 1110 over the second bit-line layer 1108. In some embodiments, the first bit-line layer 1104 and the second bit-line layer 1108 may respectively comprise a metal, such as tungsten, ruthenium, copper, aluminum, or the like. In other embodiments, the first bit-line layer 1104 and the second bit-line layer 1108 may respectively comprise doped polysilicon. In some embodiments, the dielectric layer 1106 may comprise an oxide (e.g., silicon dioxide), a nitride (e.g., silicon nitride), or the like. In some embodiments, the masking layer 1110 may comprise a nitride (e.g., silicon nitride), a carbide (e.g., silicon carbide), or the like. In various embodiments, the bit-line structure 1102 may be formed by way of a plurality of deposition processes (e.g., PVD, CVD, PE-CVD, ALD, etc.).

Figure 12:
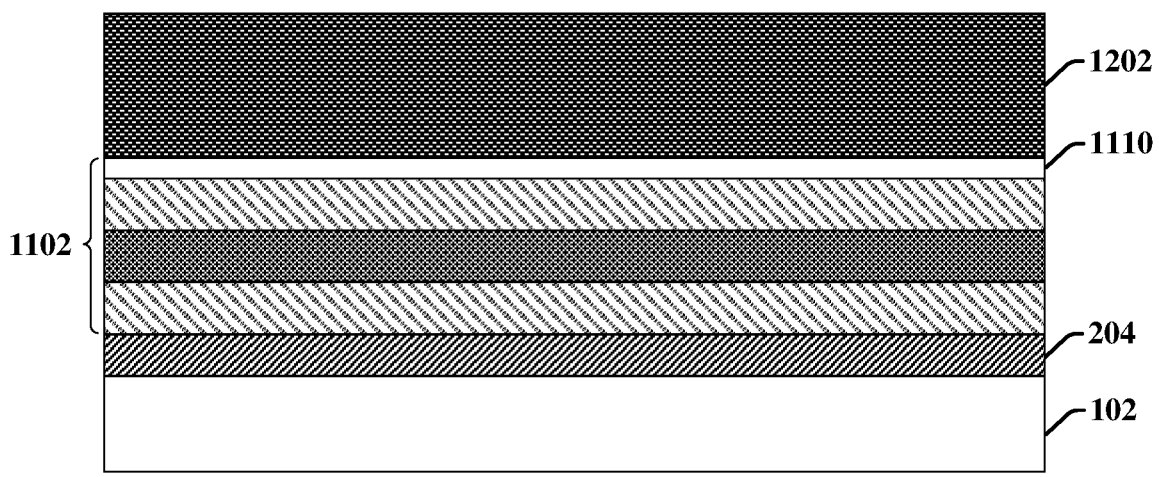

As shown in cross-sectional view 1200 of FIG. 12, a mandrel 1202 is formed over the bit-line structure 1102. The mandrel 1202 may be formed to completely cover a top surface of the masking layer 1110. In some embodiments, the mandrel 1202 may comprise an organic material. For example, the mandrel may comprise an organic material or polymer, such as a polyimide, a maleic anhydride polymer, or the like. In some embodiments, the organic material or polymer may comprise carbon. In other embodiments, the mandrel 1202 may comprise titanium oxide, tin oxide, or the like. In various embodiments, the mandrel 1202 may be formed by way of a spin coating process, a deposition processes (e.g., PVD, CVD, PE-CVD, ALD, etc.), or the like.

Figure 13:
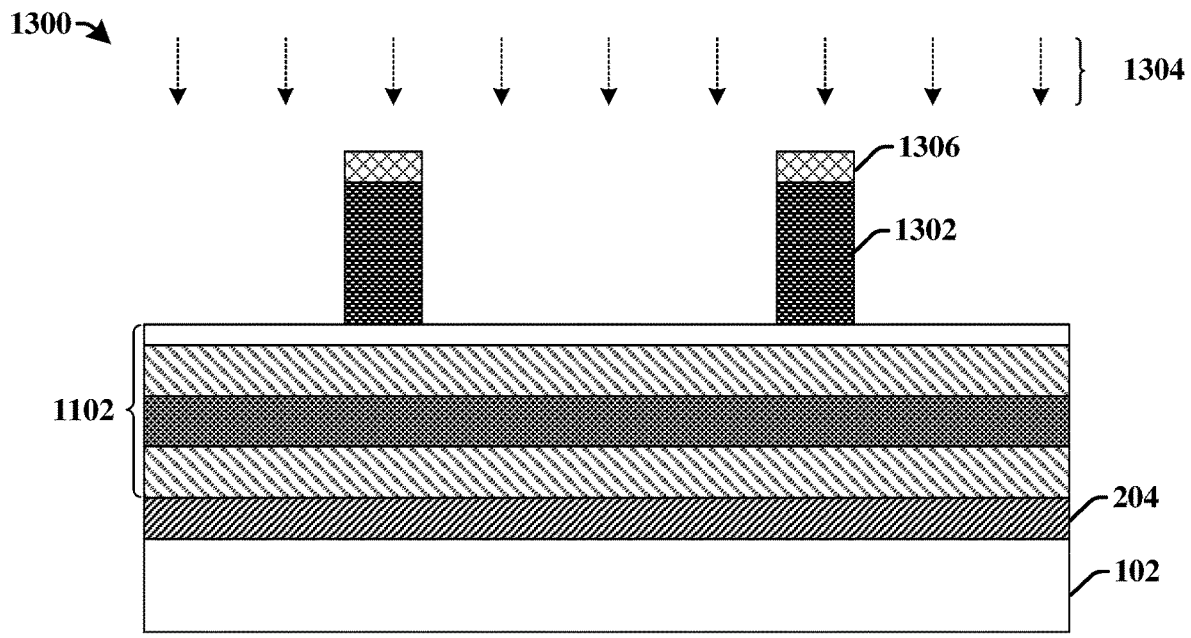

As shown in cross-sectional view 1300 of FIG. 13, the mandrel (1202 of FIG. 12) is patterned to define a patterned mandrel 1302 over the bit-line structure 1102. In some embodiments, the mandrel (1202 of FIG. 12) may be patterned by selectively exposing the mandrel (1202 of FIG. 12) to a first etchant 1304 according to a first masking layer 1306. In some embodiments, the first masking layer 1306 may comprise a photosensitive material (e.g., photoresist). In some embodiments, the first etchant 1304 may comprise a dry etchant. For example, in some embodiments, the first etchant 1304 may comprise an oxygen plasma etchant.

Figure 14:
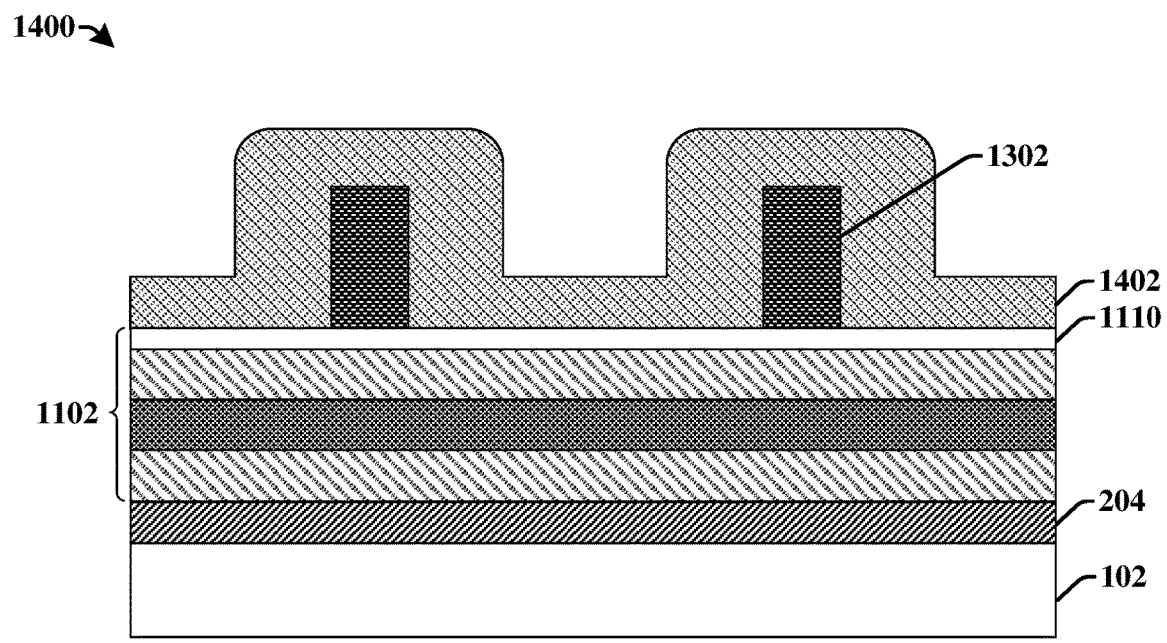

As shown in cross-sectional view 1400 of FIG. 14, a spacer layer 1402 is formed over the patterned mandrel 1302. In some embodiments, the spacer layer 1402 may be formed along horizontally extending surfaces and/or vertically extending surfaces of the patterned mandrel 1302 and along horizontally extending surfaces of the masking layer 1110. In various embodiments, the spacer layer 1402 may comprise silicon nitride, silicon dioxide, silicon oxynitride, or the like. In some embodiments, the spacer layer 1402 may be formed by way of a deposition process (e.g., PVD, CVD, PE-CVD, ALD, etc.).

Figure 15:
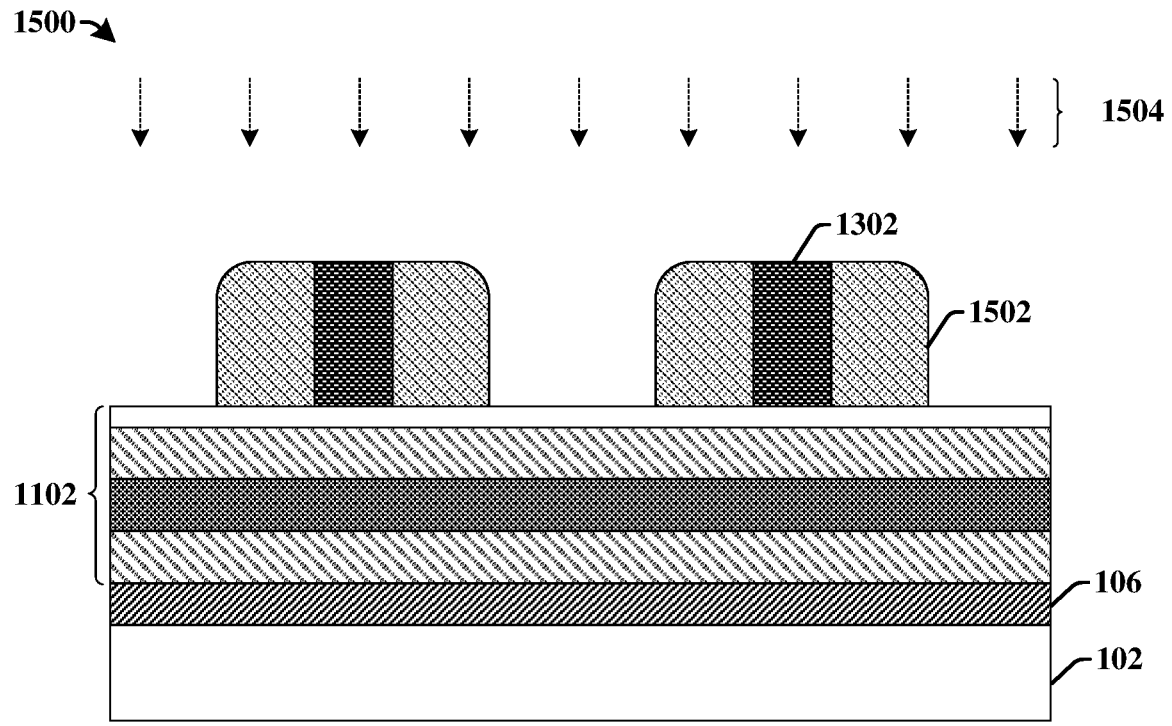

As shown in cross-sectional view 1500 of FIG. 15, the spacer layer (1402 of FIG. 14) is etched to form a plurality of spacers 1502 on opposing sides of the patterned mandrel 1302. In some embodiments, an entirety of the spacer layer (1402 of FIG. 14) is exposed to a second etchant 1504 (e.g., a dry etchant). The second etchant 1504 etches away the spacer layer in a substantially uniform manner, so that the spacer layer is removed from horizontal surfaces and remains along vertical surfaces. Removing the spacer layer from horizontal surfaces leaves the plurality of spacers 1502 along opposing sides of the patterned mandrel 1302.

Figure 16:
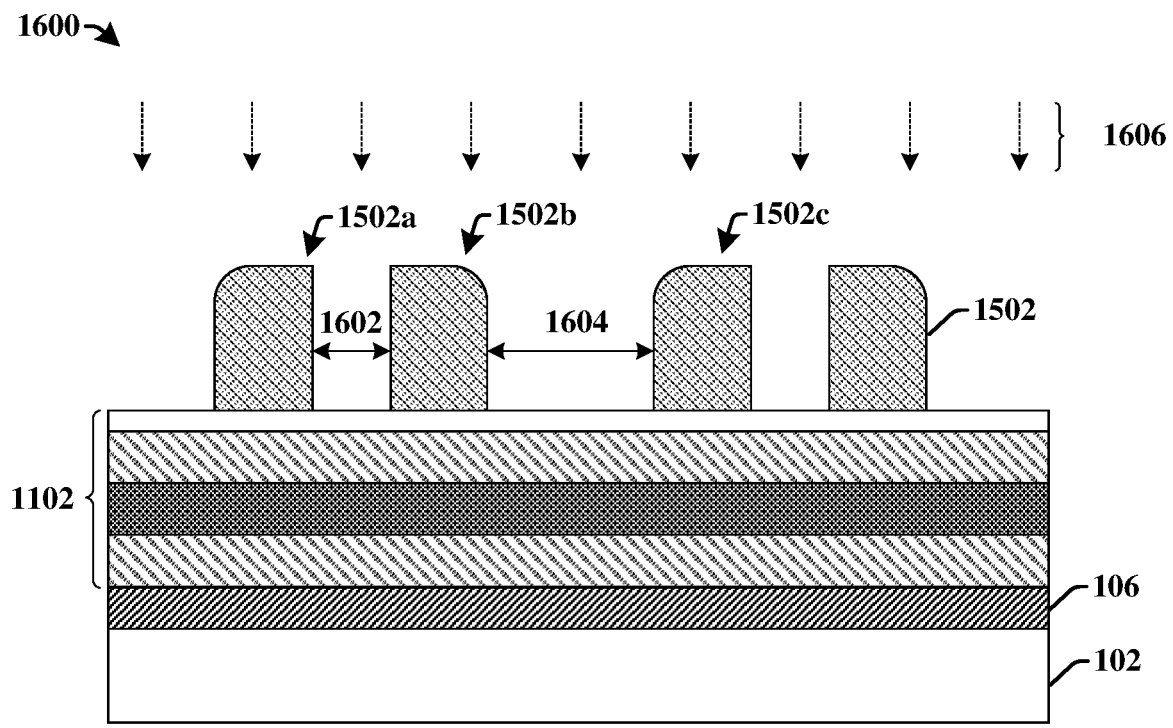

As shown in cross-sectional view 1600 of FIG. 16, the patterned mandrel (1302 of FIG. 15) is removed. Removal of the patterned mandrel (1302 of FIG. 15) results in the plurality of spacers 1502 being separated from each other by an asymmetric spacing. For example, in some embodiments, the plurality of spacers 1502 may comprise a second spacer 1502b having a first side facing a first spacer 1502a and a second side facing a third spacer 1502c. The first side is separated from the first spacer 1502a by a first distance 1602 and the second side is separated from the third spacer 1502c by a second distance 1604 that is larger than the first distance 1602. In various embodiments, the patterned mandrel (1302 of FIG. 15) may be removed by exposing the patterned mandrel to a third etchant 1606. In some embodiments, the third etchant 1606 may comprise a dry etchant. For example, in some embodiments, the third etchant 1606 may comprise an oxygen plasma etchant.

Figure 17:
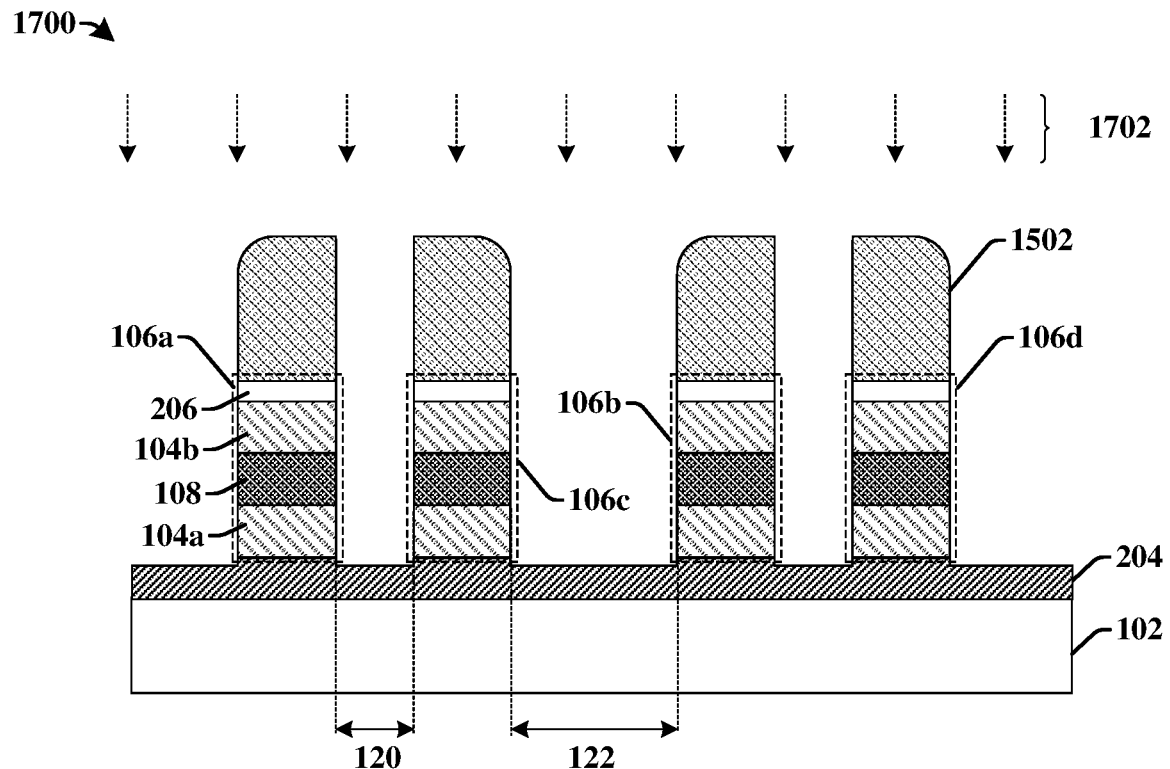

As shown in cross-sectional view 1700 of FIG. 17, the bit-line structure (1102 of FIG. 16) is selectively patterned according to the plurality of spacers 1502 to define a plurality of bit-line stacks 106a-106d. The plurality of bit-lines stacks 106a-106d respectively comprise multiple bit-lines 104a-104b onto one another. For example, a first bit-line stack 106a may comprise a first bit-line 104a separated from a second bit-line 104b by way of a dielectric material 108. The plurality of bit-lines stacks 106a-106d are disposed in an asymmetric architecture, such that opposing sides of respective ones of the plurality of bit-lines stacks 106a-106d are separated from adjacent bit-lines stacks by different distances. For example, a second bit-line stack 106b has a first side separated from a first bit-line stack 106a by a first distance 120 and a second side separated from a third bit-line stack 106c by a second distance 122 that is larger than the first distance 120. In various embodiments, the bit-line structure (1102 of FIG. 16) may be selectively patterned by exposing the bit-line structure to a fourth etchant 1702. In some embodiments, the fourth etchant 1702 may comprise a dry etchant (e.g., having a fluorine based chemistry, having a chlorine based chemistry, or the like).

Figure 18:
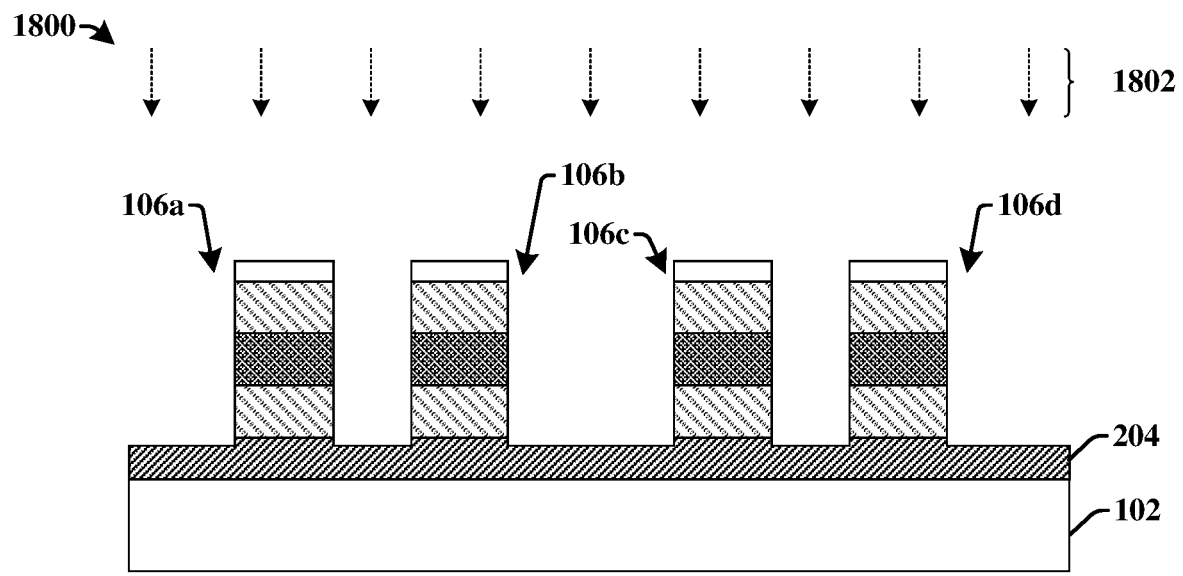

As shown in cross-sectional view 1800 of FIG. 18, the spacers (1502 of FIG. 17) are removed. In various embodiments, the spacers 1502 may be removed by way of a fifth etchant 1802. In some embodiments, the fifth etchant 1802 may comprise a wet etchant or a dry etchant.

Figure 19:
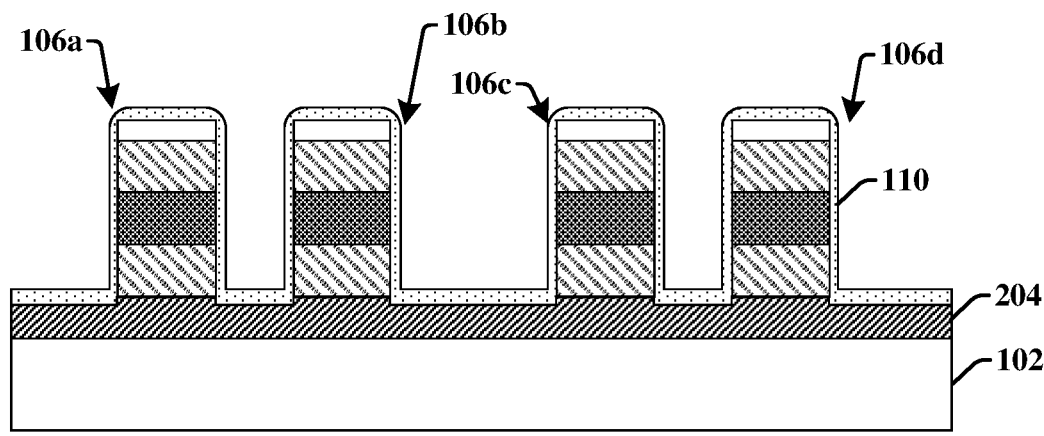

As shown in cross-sectional view 1900 of FIG. 19, a data storage structure 110 is formed over the plurality of bit-line stacks 106a-106d. In some embodiments, the data storage structure 110 may be formed along horizontally extending surfaces and vertically extending surfaces of the plurality of bit-line stacks 106a-106d. In some embodiments, the data storage structure 110 may also be formed along horizontally extending surfaces of the etch stop layer 204. In some such embodiments, the data storage structure 110 may be formed to continuously extend over the plurality of bit-line stacks 106a-106d. In various embodiments, the data storage structure 110 may comprise a high-k dielectric material, such as hafnium dioxide ($HfO_2$), zirconium dioxide ($ZrO_2$), aluminum oxide ($Al_2O_3$), tantalum pentoxide ($Ta_2O_5$), hafnium aluminum oxide (HfAlO), hafnium zirconium oxide (HfZrO), or the like. In some embodiments, the data storage structure 110 may be formed by way of one or more deposition processes (e.g., PVD, CVD, PE-CVD, ALD, etc.).

Figure 20:
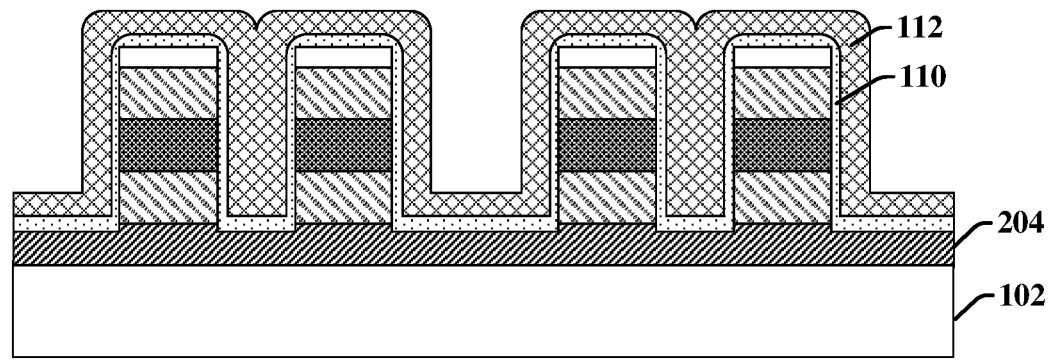

As shown in cross-sectional view 2000 of FIG. 20, a selector 112 is formed over the data storage structure 110. In some embodiments, the selector 112 may be formed along horizontally extending surfaces and/or vertically extending surfaces of the data storage structure 110. In some embodiments, the selector 112 may comprise an ovonic threshold switch (OTS). In some such embodiments, the selector 112 may be formed by depositing a binary material (e.g., SiTe, GeTe, CTe, BTe, SiAS, or the like), a ternary material (e.g., GeSeAs, GeSeSb, GeSbTe, GeSiA, or the like), or a quaternary material (e.g., GeSeAsTe, GeSeTeSi, GeSeTeAs, or the like) over the data storage structure 110 using a plurality of deposition processes (e.g., CVD, PVE, PE-CVD, etc.). In other embodiments, the selector 112 may comprise a voltage conductive bridge (VCB) formed by depositing layers (e.g., Ag/$HfO_2$, Cu/$HfO_2$, or the like) over the data storage structure 110 using a plurality of deposition processes (e.g., CVD, PVE, PE-CVD, etc.). In yet other embodiments, the selector 112 may comprise a doped-chalcogenide-based selector, a Mott effect based selector, a mixed-ionic-electronic-conductive (MIEC)-based selector, a field-assisted-superliner-threshold (FAST) selector, or the like.

Figure 21B:
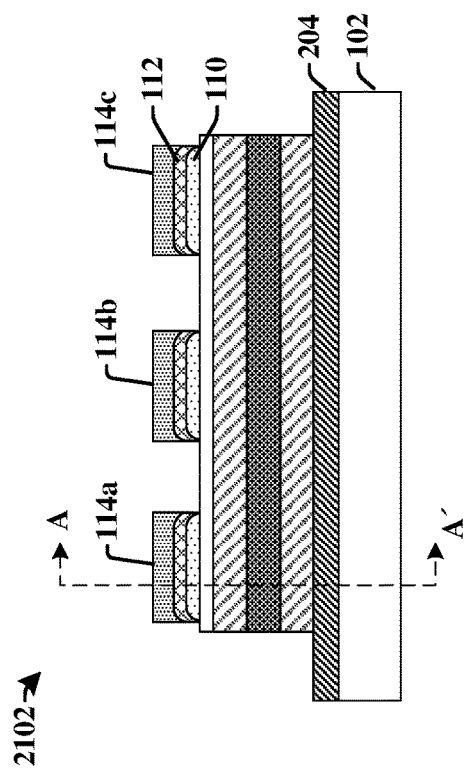
Figure 21A:
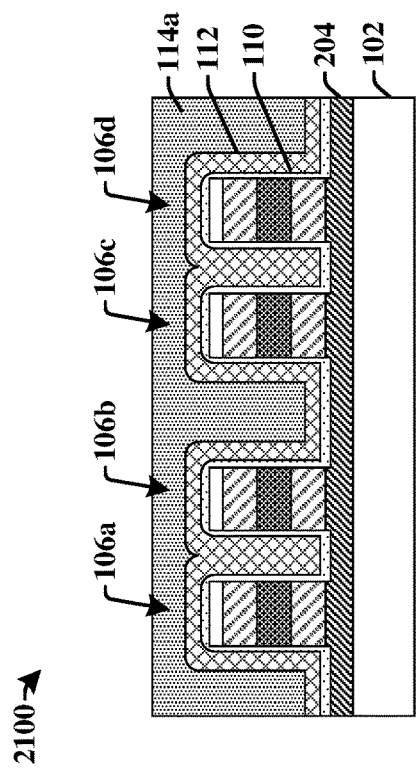

As shown in cross-sectional view 2100 of FIG. 21A and cross-sectional view 2102 of FIG. 21B, a plurality of word-lines 114a-114c are formed over the plurality of bit-line stacks 106a-106d. In some embodiments, the plurality of word-lines 114a-114c may be formed by depositing a word-line layer over the selector 112 and subsequently patterning the word-line layer to define a plurality of word-lines 114a-114c that respectively extend over the plurality of the bit-line stacks 106a-106d. In some embodiments, the etch used to pattern the word-line layer may also pattern the selector 112 and the data storage structure 110. In other embodiments, the etch used to pattern the word-line layer will not etch through the selector 112 and/or the data storage structure 110.

Figure 22B:
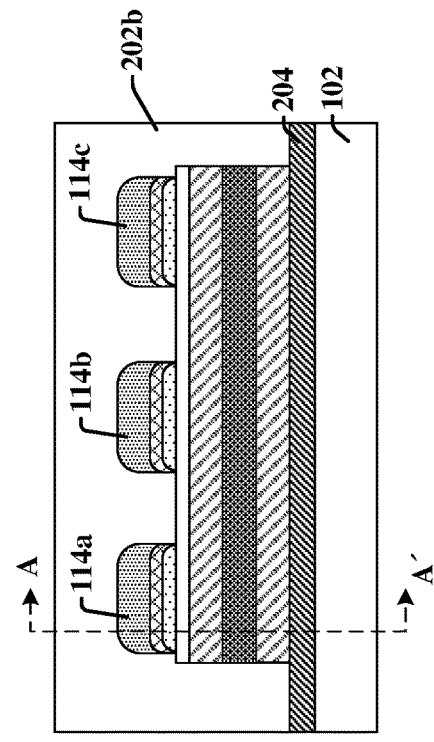
Figure 22A:
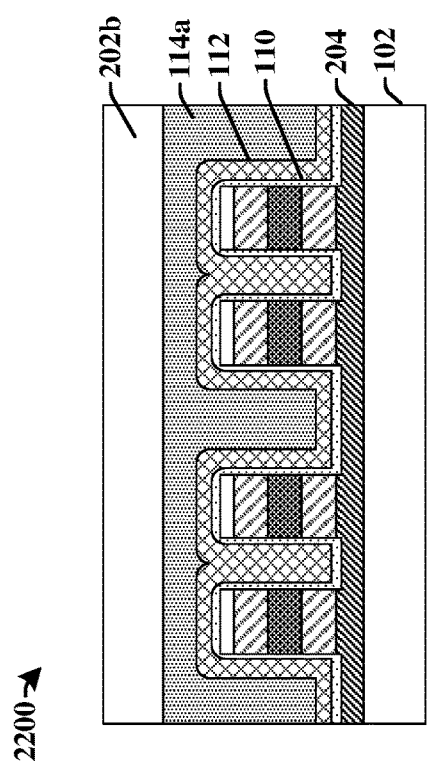

As shown in cross-sectional view 2200 of FIG. 22A and cross-sectional view 2202 of FIG. 22B, an upper inter-level dielectric (ILD) layer 202b is formed over the plurality of word-lines 114a-114c. In various embodiments, the upper ILD layer 202b may be formed by way of a deposition process (e.g., PVD, CVD, PE-CVD, or the like).

Figure 23:
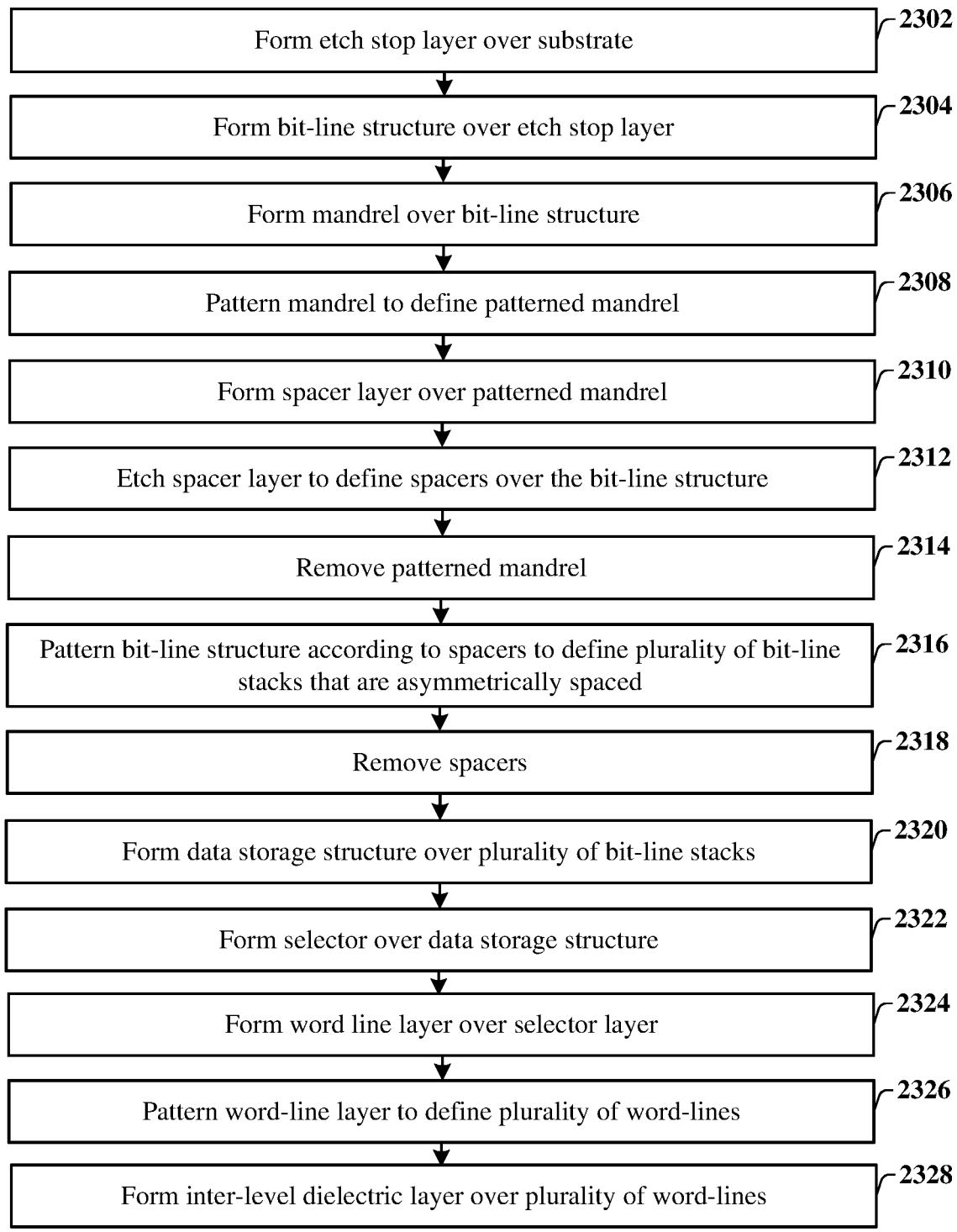
FIG. 23 illustrates a flow diagram of some embodiments of a method of forming an integrated circuit having a memory array including a plurality of bit-line stacks disposed at an asymmetric pitch.

FIG. 23 illustrates a flow diagram of some embodiments of a method 2300 of forming an integrated circuit having a memory array including bit-line stacks disposed at an asymmetric pitch.

While method 2300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2302, an etch stop layer is formed over a substrate. FIG. 10 illustrates a cross-sectional view 1000 of some embodiments corresponding to act 2302.

At 2304, a bit-line structure is formed over the etch stop layer. IN some embodiments, the bit-line structure may comprise a plurality of bit-line layers separated from one another by dielectric layers FIG. 11 illustrates a cross-sectional view 1100 of some embodiments corresponding to act 2304.

At 2306, mandrel is formed over the bit-line structure. FIG. 12 illustrates a cross-sectional view 1200 of some embodiments corresponding to act 2306.

At 2308, the mandrel is patterned to define a patterned mandrel. FIG. 13 illustrates a cross-sectional view 1300 of some embodiments corresponding to act 2308.

At 2310, a spacer layer is formed over the patterned mandrel. FIG. 14 illustrates a cross-sectional view 1400 of some embodiments corresponding to act 2310.

At 2312, the spacer layer is etched to define spacers over the bit-line structure. FIG. 15 illustrates a cross-sectional view 1500 of some embodiments corresponding to act 2312.

At 2314, the patterned mandrel is removed. FIG. 16 illustrates a cross-sectional view 1600 of some embodiments corresponding to act 2314.

At 2316, the bit-line structure is patterned according to the spacers to define a plurality of bit-line stacks, which are asymmetrically spaced. In some embodiments, the plurality of bit-line stacks respectively have two or more bit-lines stacked onto one another. FIG. 17 illustrates a cross-sectional view 1700 of some embodiments corresponding to act 2316.

At 2318, the spacers are removed. FIG. 18 illustrates a cross-sectional view 1800 of some embodiments corresponding to act 2318.

At 2320, a data storage structure is formed over the bit-line stacks. FIG. 19 illustrates a cross-sectional view 1900 of some embodiments corresponding to act 2320.

At 2322, a selector is formed over the data storage structure. FIG. 20 illustrates a cross-sectional view 2000 of some embodiments corresponding to act 2322.

At 2324, a word-line layer is formed over the selector. FIGS. 21A-21B illustrates cross-sectional views, 2100 and 2102, of some embodiments corresponding to act 2324.

At 2326 the word-line layer is patterned to define a plurality of word-lines extending over the plurality of bit-line stacks. FIGS. 21A-21B illustrates cross-sectional views, 2100 and 2102, of some embodiments corresponding to act 2326.

At 2328, an inter-level dielectric (ILD) layer is formed over the plurality of word-lines. FIGS. 22A-22B illustrates cross-sectional views, 2200 and 2202, of some embodiments corresponding to act 2328.

Accordingly, in some embodiments, the present disclosure relates to an integrated circuit comprising memory array having a plurality of bit-line stacks disposed at an asymmetric pitch (e.g., a plurality of bit-line stacks having opposing sides that are separated from adjacent bit-line stacks by different distances). By having the plurality of bit-line stacks disposed at an asymmetric pitch, variations between RRAM devices associated with the bit-line stacks can be reduced.

In some embodiments, the present disclosure relates to an integrated circuit. The integrated circuit includes a plurality of bit-line stacks disposed over a substrate and respectively including a plurality of bit-lines stacked onto one another; a data storage structure is over the plurality of bit-line stacks; a selector is over the data storage structure; a word-line is over the selector, the selector is configured to selectively allow current to pass between the plurality of bit-lines and the word-line; the plurality of bit-line stacks include a first bit-line stack, a second bit-line stack, and a third bit-line stack, the first bit-line stack and the third bit-line stack are closest bit-line stacks to opposing sides of the second bit-line stack; and the second bit-line stack is separated from the first bit-line stack by a first distance and is further separated from the third bit-line stack by a second distance larger than the first distance. In some embodiments, the data storage structure continuously extends from directly over the first bit-line stack to directly over the second bit-line stack. In some embodiments, the selector continuously extends from directly over the first bit-line stack to directly over the second bit-line stack. In some embodiments, the plurality of bit-line stacks respectively include a first bit-line vertically separated from a second bit-line by a dielectric material covering a top surface of the first bit-line. In some embodiments, the dielectric material is completely confined over the top surface of the first bit-line and the second bit-line is completely confined over a top surface of the dielectric material. In some embodiments, an upper surface of the selector is completely over tops of the first bit-line stack and the second bit-line stack along an entire distance between the first bit-line stack and the second bit-line stack. In some embodiments, the selector includes one or more interior surfaces that define a void disposed directly between the first bit-line stack and the second bit-line stack. In some embodiments, the data storage structure defines a plurality of resistive random access memory (RRAM) devices respectively configured to store a data state. In some embodiments, an upper surface of the data storage structure is completely over tops of the first bit-line stack and the second bit-line stack along an entire distance between the first bit-line stack and the second bit-line stack. In some embodiments, the data storage structure includes one or more interior surfaces that define a void disposed directly between the first bit-line stack and the second bit-line stack.

In other embodiments, the present disclosure relates to an integrated circuit. The integrated circuit includes a first bit-line stack disposed over a substrate; a second bit-line stack disposed over the substrate, the second bit-line stack having a first side facing the first bit-line stack and a second side facing away from the first bit-line stack; a data storage structure disposed over and along sidewalls of the first bit-line stack and the second bit-line stack; a selector disposed over the data storage structure; and a word-line disposed over the selector and having a first sidewall facing the first side of the second bit-line stack and a second sidewall facing the second side of the second bit-line stack, the first sidewall is closest sidewall of the word-line to the second bit-line stack along the first side of the second bit-line stack and the second sidewall is a closest sidewall of the word-line to the second bit-line stack along the second side of the second bit-line stack, and the first sidewall separated from the first side by a first distance that is larger than a second distance between the second sidewall and the second side. In some embodiments, the first bit-line stack includes a first bit-line separated from a second bit-line by a dielectric material. In some embodiments, the integrated circuit further includes a third bit-line stack disposed over the substrate, the first bit-line stack is a closest bit-line stack to the first side of the second bit-line stack and the third bit-line stack is a closest bit-line stack to the second side of the second bit-line stack; and the second bit-line stack is separated from the first bit-line stack by a third distance and is separated from the third bit-line stack by a fourth distance that is larger than the third distance. In some embodiments, the fourth distance is between approximately 150% and 200% of the third distance. In some embodiments, the first bit-line stack has a width that is less than the third distance. In some embodiments, the third distance is between approximately 200% and approximately 400% of the width. In some embodiments, the data storage structure is configured to store data along the first side of the second bit-line stack and not along the second side of the second bit-line stack.

In yet other embodiments, the present disclosure relates to a method of forming an integrated chip. The method includes forming a bit-line structure over a substrate, the bit-line structure having a first bit-line layer; forming a patterned mandrel over the bit-line structure; forming one or more spacers along opposing sides of the patterned mandrel; removing the patterned mandrel after forming the one or more spacers; patterning the bit-line structure according to the one or more spacers after removing the patterned mandrel to define a plurality of bit-line stacks; forming a data storage structure over the plurality of bit-line stacks; forming a selector over the data storage structure; and forming a word-line over the selector, the word-line extending over the plurality of bit-line stacks. In some embodiments, the plurality of bit-line stacks include a first bit-line stack, a second bit-line stack, and a third bit-line stack, the first bit-line stack is a closest bit-line stack to a first side of the second bit-line stack and the third bit-line stack is a closest bit-line stack to a second side of the second bit-line stack; and the second bit-line stack is separated from the first bit-line stack by a first distance and is separated from the third bit-line stack by a second distance that is larger than the first distance. In some embodiments, the plurality of bit-line stacks further include a dielectric material disposed over an upper surface of the first bit-line layer; and a second bit-line layer disposed over an upper surface of the dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, comprising:
    forming a bit-line structure over a substrate, wherein the bit-line structure comprises a first bit-line layer;
    forming a patterned mandrel over the bit-line structure;
    forming one or more spacers along opposing sides of the patterned mandrel;
    removing the patterned mandrel after forming the one or more spacers;
    patterning the bit-line structure according to the one or more spacers after removing the patterned mandrel to define a plurality of bit-line stacks, wherein the plurality of bit-line stacks comprise a first bit-line stack, a second bit-line stack, and a third bit-line stack, the first bit-line stack is a closest bit-line stack to a first side of the second bit-line stack and the third bit-line stack is a closest bit-line stack to a second side of the second bit-line stack;
    forming a data storage structure over the plurality of bit-line stacks;
    forming a selector over the data storage structure;
    forming a word-line over the selector, wherein the word-line extends over the plurality of bit-line stacks; and
    wherein the second bit-line stack is separated from the first bit-line stack by a first distance and is separated from the third bit-line stack by a second distance that is larger than the first distance.

2. The method of claim 1, wherein the bit-line structure further comprises:
    a dielectric material disposed over an upper surface of the first bit-line layer; and
    a second bit-line layer disposed over an upper surface of the dielectric material.

3. The method of claim 1, wherein the plurality of bit-line stacks respectively comprise a first bit-line vertically separated from a second bit-line by a dielectric material covering a top surface of the first bit-line.

4. A method of forming an integrated circuit, comprising:
    forming a bit-line structure over a substrate, wherein the bit-line structure comprises a plurality of bit-line layers separated by a dielectric;
    patterning the bit-line structure to form a plurality of bit-line stacks laterally separated from one another, wherein the plurality of bit-line stacks comprise a first bit-line stack, a second bit-line stack, and a third bit-line stack, the first bit-line stack and the third bit-line stack being closest neighboring bit-line stacks to opposing sides of the second bit-line stack;
    forming a data storage structure along opposing sides of the plurality of bit-line stacks, the data storage structure continuously extending from directly over the first bit-line stack to directly over the second bit-line stack;
    forming a selector on opposing sides of the data storage structure;
    forming a word-line over the selector, wherein the word-line is laterally separated from the data storage structure by the selector; and
    wherein the first bit-line stack is laterally separated from the second bit-line stack by a first distance that is smaller than a second distance between the second bit-line stack and the third bit-line stack.

5. The method of claim 4, further comprising:
forming the data storage structure to continuously extend from along the opposing sides of the plurality of bit-line stacks to directly over the plurality of bit-line stacks.

6. The method of claim 4, wherein the selector both laterally and vertically separates the word-line from the data storage structure.

7. The method of claim 4, wherein the selector continuously extends from directly over the first bit-line stack to directly over the second bit-line stack.

8. The method of claim 4, wherein the selector comprises an ovonic threshold switch, a binary material, a ternary material, a quaternary material, or a voltage conductive bridge.

9. The method of claim 4, further comprising:
forming a second word-line over the selector, the word-line being separated from the second word-line along a first direction; and
wherein the plurality of bit-line stacks are separated along a second direction that is perpendicular to the first direction, the plurality of bit-line stacks continuously extending in the first direction from directly below the word-line to directly below the second word-line.

10. A method of forming an integrated circuit, comprising:
forming a bit-line structure over a substrate, wherein the bit-line structure comprises a plurality of bit-line layers separated by a dielectric;
patterning the bit-line structure to form a first bit-line stack, a second bit-line stack, and a third bit-line stack;
forming a data storage structure along sidewalls of the first bit-line stack, the second bit-line stack, and the third bit-line stack;
forming a selector on sidewalls of the data storage structure, wherein an upper surface of the selector is completely over tops of the first bit-line stack and the second bit-line stack along an entire distance between the first bit-line stack and the second bit-line stack; and
forming a word-line over the selector and directly between the sidewalls of the first bit-line stack and the third bit-line stack, wherein the word-line has a lower surface that continuously extends from directly over the first bit-line stack to directly over the second bit-line stack.

11. The method of claim 10, wherein the selector comprises one or more interior surfaces that define a void disposed directly between the first bit-line stack and the second bit-line stack.

12. The method of claim 10, wherein the data storage structure comprises one or more interior surfaces that define a void disposed directly between the first bit-line stack and the second bit-line stack.

13. The method of claim 10, wherein an entirety of the selector that is laterally between the first bit-line stack and the second bit-line stack is completely vertically above the top of the first bit-line stack.

14. The method of claim 10, wherein the word-line is not directly and laterally between the first bit-line stack and the second bit-line stack.

15. The method of claim 10, wherein the second bit-line stack and the third bit-line stack are asymmetrically spaced apart from the first bit-line stack.

16. The method of claim 10, further comprising:
forming a mandrel over the bit-line structure;
forming one or more spacers along opposing sides of the mandrel;
removing the mandrel after forming the one or more spacers; and
patterning the bit-line structure according to the one or more spacers after removing the mandrel.

17. The method of claim 16, further comprising:
forming a masking layer over the bit-line structure prior to forming the mandrel;
patterning the masking layer according to the one or more spacers; and
forming the data storage structure over the masking layer after patterning the masking layer.

18. The method of claim 10, wherein the data storage structure is formed to continuously extend from the sidewalls of the first bit-line stack and the second bit-line stack to over the tops of the first bit-line stack and the second bit-line stack.

19. The method of claim 10, wherein the data storage structure and the selector continuously extend over the first bit-line stack, the second bit-line stack, and the third bit-line stack after forming the word-line.

20. The method of claim 10, wherein the first bit-line stack has a width that is in a range of between approximately 5 nanometers and approximately 25 nanometers.

* * * * *